US011610035B2

(12) United States Patent
Le Chevalier et al.

(10) Patent No.: US 11,610,035 B2
(45) Date of Patent: *Mar. 21, 2023

(54) ACTIVITIES DATA MODELING IN HUMAN INTERNET-OF-THINGS PLATFORMS

(71) Applicant: TheConnectedGrip, Inc., San Jose, CA (US)

(72) Inventors: Vincent Le Chevalier, San Jose, CA (US); William Vablais, Indian Wells, CA (US)

(73) Assignee: TheConnectedGrip, Inc., San Jose, CA (US)

(*) Notice: Subject to any disclaimer, the term of this patent is extended or adjusted under 35 U.S.C. 154(b) by 132 days.

This patent is subject to a terminal disclaimer.

(21) Appl. No.: 17/207,604

(22) Filed: Mar. 20, 2021

(65) Prior Publication Data
US 2021/0279382 A1 Sep. 9, 2021

Related U.S. Application Data

(63) Continuation of application No. 15/937,782, filed on Mar. 27, 2018, now Pat. No. 10,956,630.

(51) Int. Cl.
*H04L 67/306* (2022.01)
*A63B 24/00* (2006.01)
(Continued)

(52) U.S. Cl.
CPC ............ *G06F 30/20* (2020.01); *A63B 5/20* (2013.01); *A63B 21/0552* (2013.01);
(Continued)

(58) Field of Classification Search
CPC .. G06F 30/20; G06F 16/24578; G06F 16/283; G06F 16/436; G06F 16/735;
(Continued)

(56) References Cited

U.S. PATENT DOCUMENTS 6,537,076 B2 * 3/2003 McNitt ............. A63B 24/0003
434/257
8,953,909 B2 2/2015 Guckenberger et al.
(Continued)

OTHER PUBLICATIONS

Su et al. "Ontological Knowledge Engine and Health Screening Data Enabled Ubiquitous Personalized Physical Fitness (UFIT)". Sensors 2014, 14, 4560-4584; doi:10.3390/s140304560. pp. 4560-4584. (Year: 2014).*

*Primary Examiner* — Eunhee Kim
(74) *Attorney, Agent, or Firm* — Huse IP Law; Charles C. Huse

(57) ABSTRACT

A platform models and correlates physical activities based on users' interactions with a simple grip-metaphor design, enabling multi-dimensions actionable information to improve the health, performance and well-being of connected grip users within like-minded communities. For example, the platform captures multi-dimensional datasets generated from activities of each of a plurality of users on the online human internet of thing platform, where the activities include physical interactions with connected grips systems connected to the online human internet of thing platform. The platform then filters the captured multi-dimensional datasets into a plurality of categories and scores the filtered multi-dimensional data by the human internet of thing platform. Finally, the platform generates a multi-dimensional information modeling for each user based on the scored multi-dimensional data.

14 Claims, 12 Drawing Sheets

Related U.S. Application Data

(60) Provisional application No. 62/478,798, filed on Mar. 30, 2017.

(51) Int. Cl.

| | | |
|---|---|---|
| *A63B 21/072* | (2006.01) | |
| *A63B 5/20* | (2006.01) | |
| *A63B 21/055* | (2006.01) | |
| *A63B 21/00* | (2006.01) | |
| *H04L 67/12* | (2022.01) | |
| *G06F 30/20* | (2020.01) | |
| *G06F 16/28* | (2019.01) | |
| *G06F 16/2457* | (2019.01) | |
| *G06F 16/735* | (2019.01) | |
| *G06F 16/435* | (2019.01) | |

(52) U.S. Cl.
CPC ........ *A63B 21/072* (2013.01); *A63B 21/4035* (2015.10); *A63B 24/0075* (2013.01); *G06F 16/24578* (2019.01); *G06F 16/283* (2019.01); *G06F 16/436* (2019.01); *G06F 16/735* (2019.01); *H04L 67/306* (2013.01); *A63B 2024/0081* (2013.01); *A63B 2220/833* (2013.01); *A63B 2230/04* (2013.01); *A63B 2230/50* (2013.01); *H04L 67/12* (2013.01)

(58) Field of Classification Search
CPC ..... A63B 5/20; A63B 21/0552; A63B 21/072; A63B 21/4035; A63B 24/0075; A63B 2024/0081; A63B 2220/833; A63B 2230/04; A63B 2230/50; H04L 67/306; H04L 67/12
See application file for complete search history.

(56) References Cited

U.S. PATENT DOCUMENTS

| | | | |
|---|---|---|---|
| 2012/0277891 A1* | 11/2012 | Aragones | G09B 19/003 700/91 |
| 2015/0032236 A1* | 1/2015 | Yu | G06Q 10/06 700/91 |
| 2017/0278419 A1* | 9/2017 | Wells | G01C 22/006 |
| 2017/0368413 A1* | 12/2017 | Shavit | A63B 24/0075 |

* cited by examiner

ACTIVITIES DATA MODELING IN HUMAN INTERNET-OF-THINGS PLATFORMS

RELATED APPLICATIONS

This application is a continuation of U.S. patent application Ser. No. 15/937,782, filed on Mar. 27, 2018, issued as U.S. Pat. No. 10,956,630 on Mar. 23, 2021, which claims priority to U.S. Provisional Patent Application No. 62/478,798, filed on Mar. 30, 2017, both applications of which are incorporated by reference in their entirety.

BACKGROUND

The current generation of fitness, health and sports activity trackers are defined by a typically passive always-on capture and aggregation of users' activities data over the course of day/week and month timeframe. This type of general-purpose data capture, along with its simple dashboard representation, while presenting some benefit to the users, is inherently constrained by its basic lack of contextual information from the activities actually performed by the users, thus limiting the value of that data to a one-way experience where no active user feedback, coaching or interactions from users sharing similar interests are provided.

While the various products that we interact with are getting increasingly customized, by contrast, the human grip, as the main and only physical connection between a product and its user, has remained remarkably unchanged. This provides an opportunity to rethink and disrupt the accepted shape and function of this valuable human internet of things form-factor for both the consumer and professional markets.

SUMMARY

Embodiments of the invention relate to the capture, processing, management and artificial intelligence systems which collect the contextual information of the captured user activities data and transform it into multi-dimensions actionable information to improve the health, performance and wellbeing of users within like-minded communities.

By embedding an array of sensors for motion, physiology, environmental and other sensitive data using embedded microcontroller network technology, this invention describes a new method and system for modeling activities based on the users' interactions with a simple grip-metaphor design for many B2B and B2C offerings.

By focusing on the human grip, as the interface between the physical and virtual [data] worlds, value-added data modeling applications and services to existing grip-based devices becomes generic but also integrated into many market opportunities, such as sports, fitness equipment, health monitoring, activity tracking, professional coaching, physical therapy, mobility aide and virtual entertainment, among others.

DETAILED DESCRIPTION

Embodiments of the invention provide a human internet of things platform that is modeling and categorizing the various exercises captured from the use of grip-based products activities, such as hand strength grip, jump ropes, elastic bands, weight lifting, barbells, rowing, cycling, tennis rackets, golf clubs, ski poles or police batons, among others.

By modeling each captured activity-based exercise based on its unique set of contextual sensors data, the platform is building collections of exercise-based cards into activity-based deck of cards, such as jump ropes deck, elastic bands deck or rowing deck that are organized and managed based on the profile of the users and the specific activities and exercises that they perform, either by themselves, or in a group.

Reference users, such as professional trainers, coach or fitness experts are generating unique sets of activity-based referenced exercises datasets from the real-time capture of their sensors that the platform processes into specific collections of card-based reference activity datasets.

Non-reference users, such as product consumers, are generating their own set of unique activity-based exercises datasets from the real-time capture of their sensors that the platform correlates against their respective historical datasets and recorded reference datasets collections, effectively providing personalized coaching and predictive analytic services to its users while they engage in grip-related product activities.

Embodiments of the invention are architected around 3 main components and related systems, as listed:
  Connected grips
  Software applications
  Contextual data modeling analytic platform and services
  FIG. 1 illustrates the 3 components of the human internet of things platform.

Figure 1:
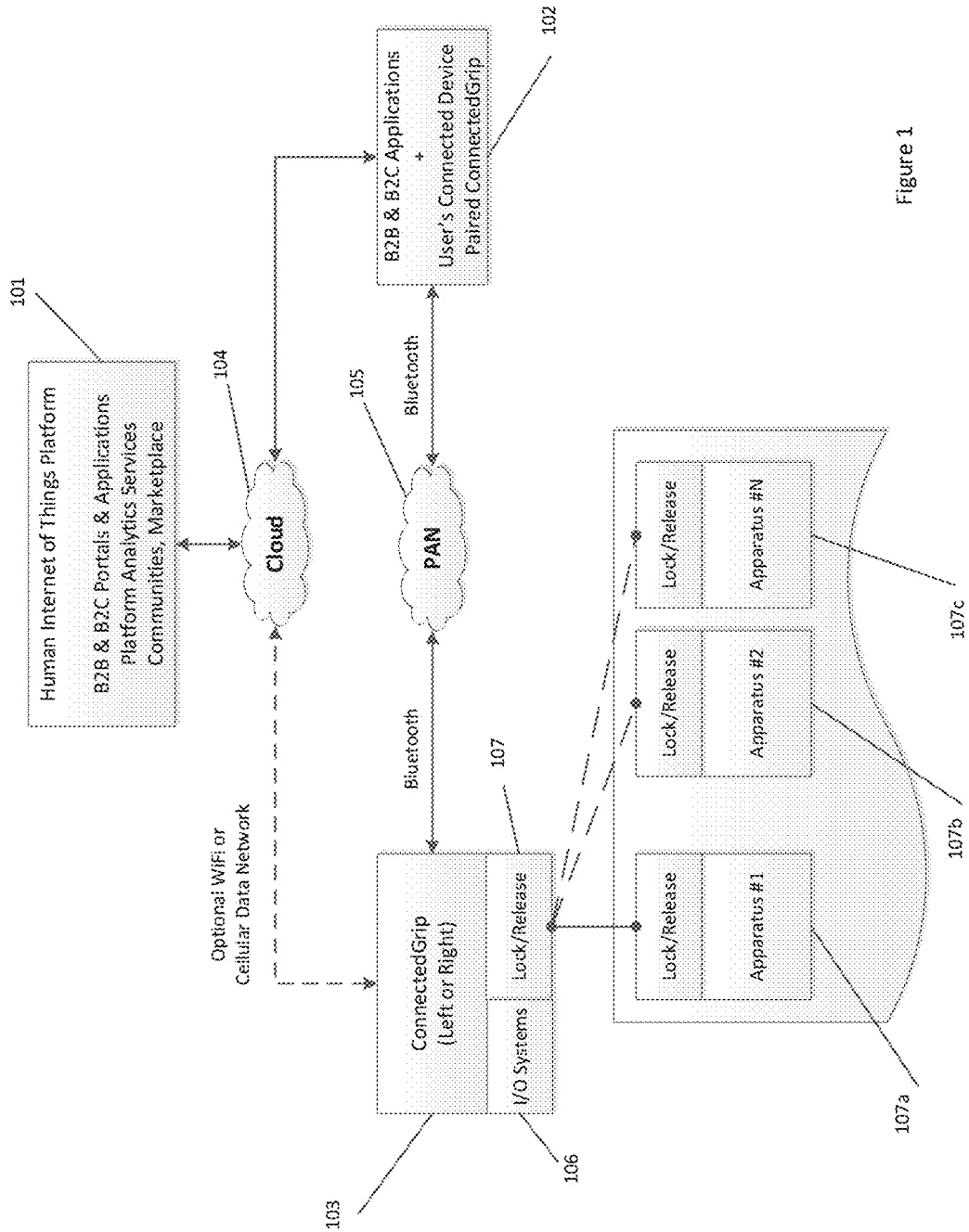
FIG. 1 illustrates the three components of the human internet of things platform.

As indicated in FIG. 1, the connected grips 103 are configured as human internet of things devices which may be used stand-alone, in pair (i.e. one per hand), or in dual-handle (i.e. one handle with two connected grips), and that may include support for securely attaching various mechanical apparatus 107, such as a jump rope 107a, elastic band 107b or rowing chain 107c, for examples.

Based on the type of connected grips systems, the I/O Systems 106 are integrating one or components, such as webcam, near-field communications, Bluetooth or fingerprint scanners, for examples, which can be used to match a single individual while engaging with a particular connected grips system 103 to the recorded profile of a registered user of the human internet of things platform 101.

The connected grips 103 are paired to a user's connected device 102, such as a smartphone, tablet or integrated computer system, via a wireless integrated personal area network 105 (PAN), such as Bluetooth. Other wireless networks such as Wi-Fi or cellular data networks 104 may also be integrated. Captured sensors datasets are encrypted and securely uploaded over the available wireless networks.

The paired user's connected device 102 is processing the captured encrypted sensors dataset via a set of downloadable consumer and/or professional applications. Contextual dataset is uploaded in parallel to the human internet of things platform 101 and back-end systems for additional processing and services.

Services are typically based on a combination of data visualization, personalized recommendations, social interchange and online marketplace resulting from the modeling and analytic of artificial intelligence algorithms applied to the collections of user activity datasets.

Single User Mode

By definition, a connected grip 103 is specifically designed as an internet of thing device to be gripped by the hand of a user.

Depending on the type of connected grip activities or exercises, a registered user is typically interacting with up to two connected grips at the same time, one for the left hand and the other for the right hand. Other configurations may include interactions with three, four or more connected grip at the same time based on type of activities. In addition, dual-handle activities, such as rowing for example, include interactions with a pair of connected grips integrated into a single handle.

Figure 2:
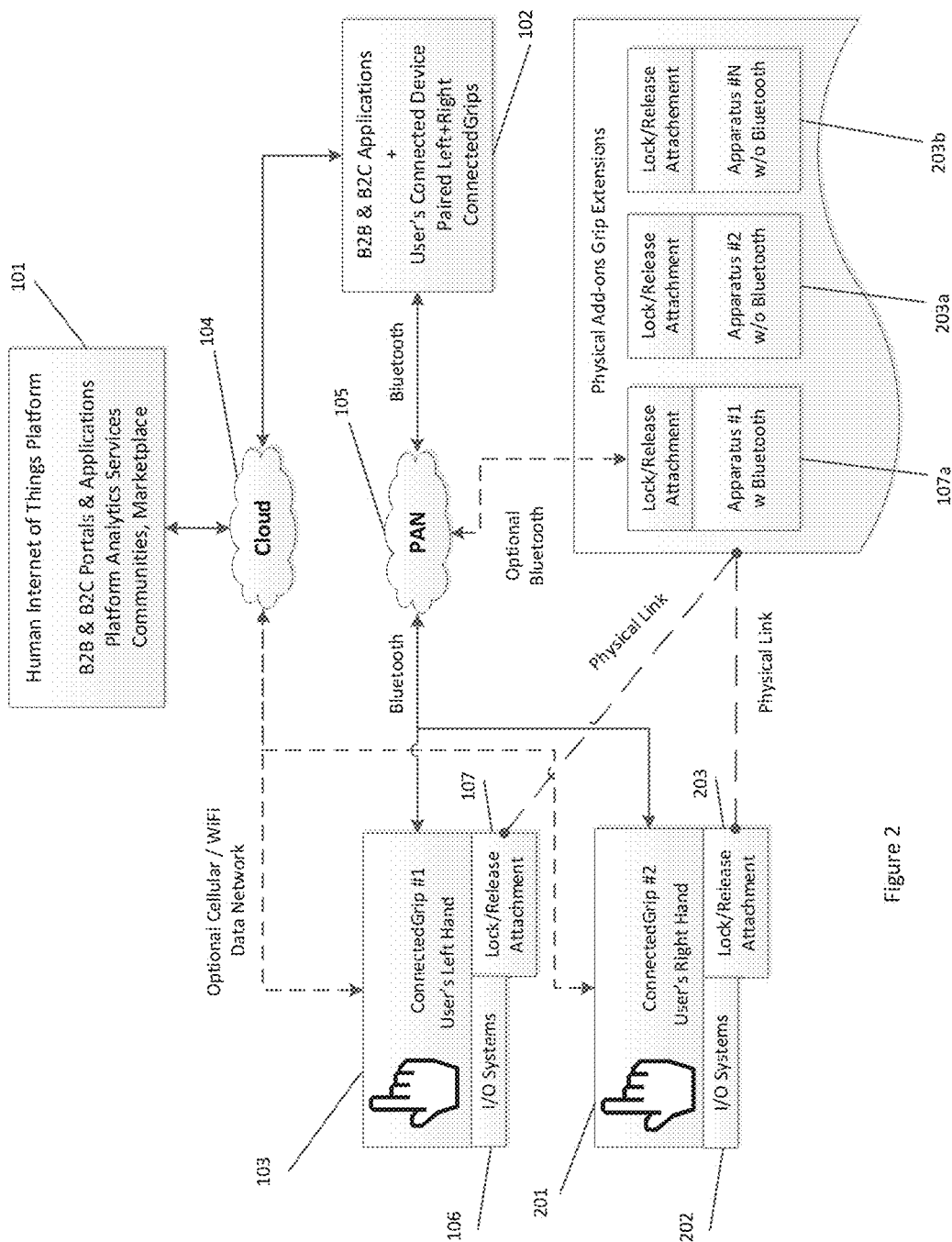
FIG. 2 illustrates a set of two connected grips paired to the user's connected device in a human internet of things platform.

FIG. 2 illustrates a set of two connected grips, 103 and 201, paired to the user's connected device 102 in human internet of things platforms 101. In this mode, each connected grip is connected over a local PAN 105 and streams real-time user datasets captured from both left and right hands of the user when engaging with the connected grips 103 and 201.

Each connected grip can be physically attached to a set of specific apparatus via its universal connector to lock and release in synchronous or asynchronous mode. For example, a jump rope, may be attached, or detached, to a pair of connected grips. As another example, a dual-handle may be attached, or detached, to the chain of a rowing system.

When interacting with two connected grips within a particular activity, the platform analyses the individual exercises performed from both the left and right side of the body of the registered user, effectively enabling a comparison between the 2 sides of its body given comparable exercises. This provides valuable and actionable feedback to the registered user by being able to focus on a set of personalized activities and exercises that overtime compensate for the measured differences between both sides of the body.

Multiple Users Mode

When multiple users interact with their respective connected grips, the human internet of things platform enables selected synchronization services that process the incoming user datasets when they perform the same type of exercises within a particular activity. This enables the platform services to correlate one user exercise with another user of similar exercise, profile, or with a group of users, providing access to like-minded social communities, personalized feedback, individual coaching, groups coaching or competitive events.

Figure 3:
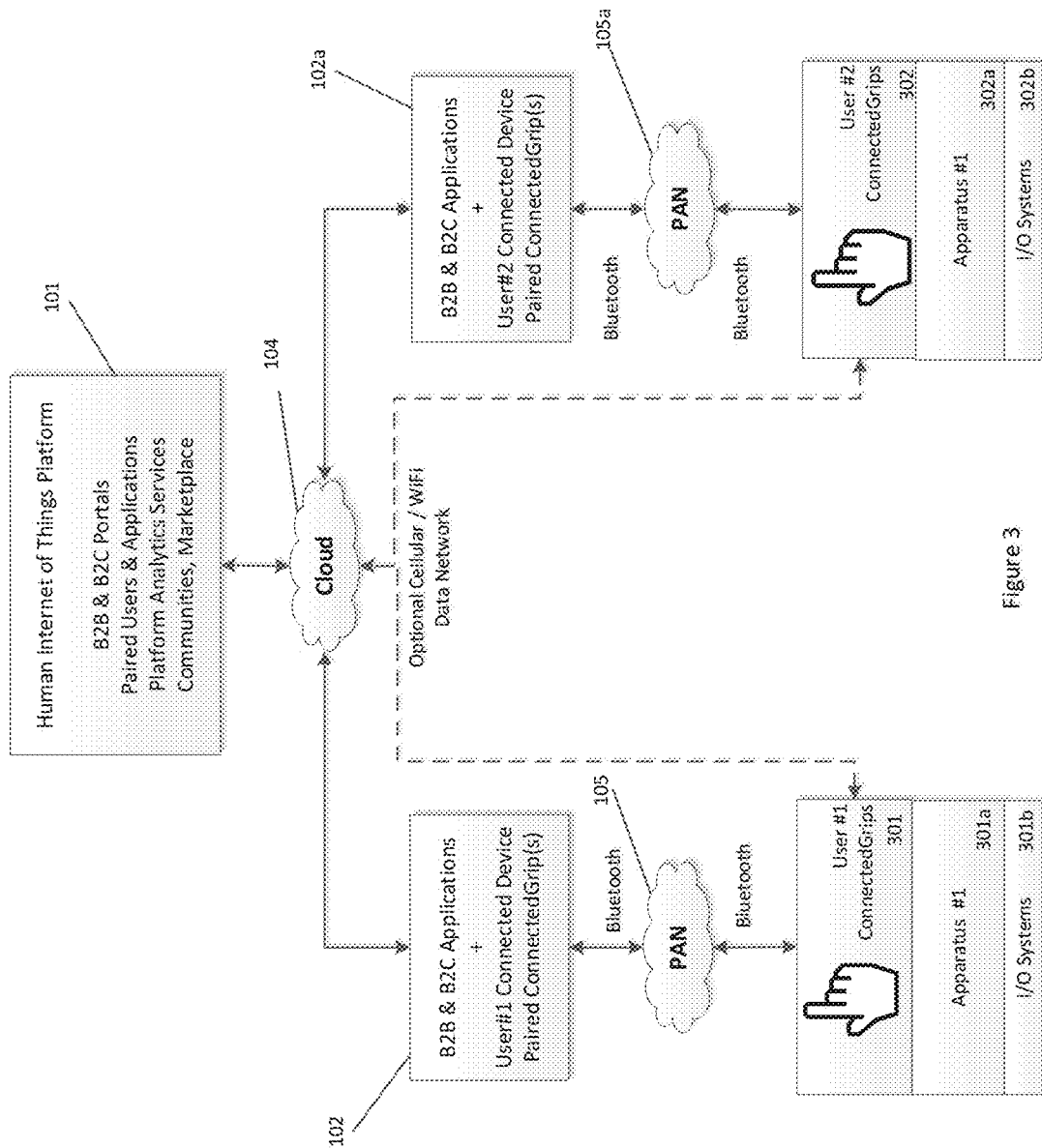
FIG. 3 illustrates two distinct users, each interacting with at least one connected grip in a human internet of things platform.

FIG. 3 illustrates 2 distinct users each interacting with at least one connected grip 301 and 302 in a human internet of things platform 101. In this mode, each connected grip is connected over a local PAN and streams real-time user datasets to the platform which performs aggregation and synchronization of the registered user's captured datasets.

Figure 4:
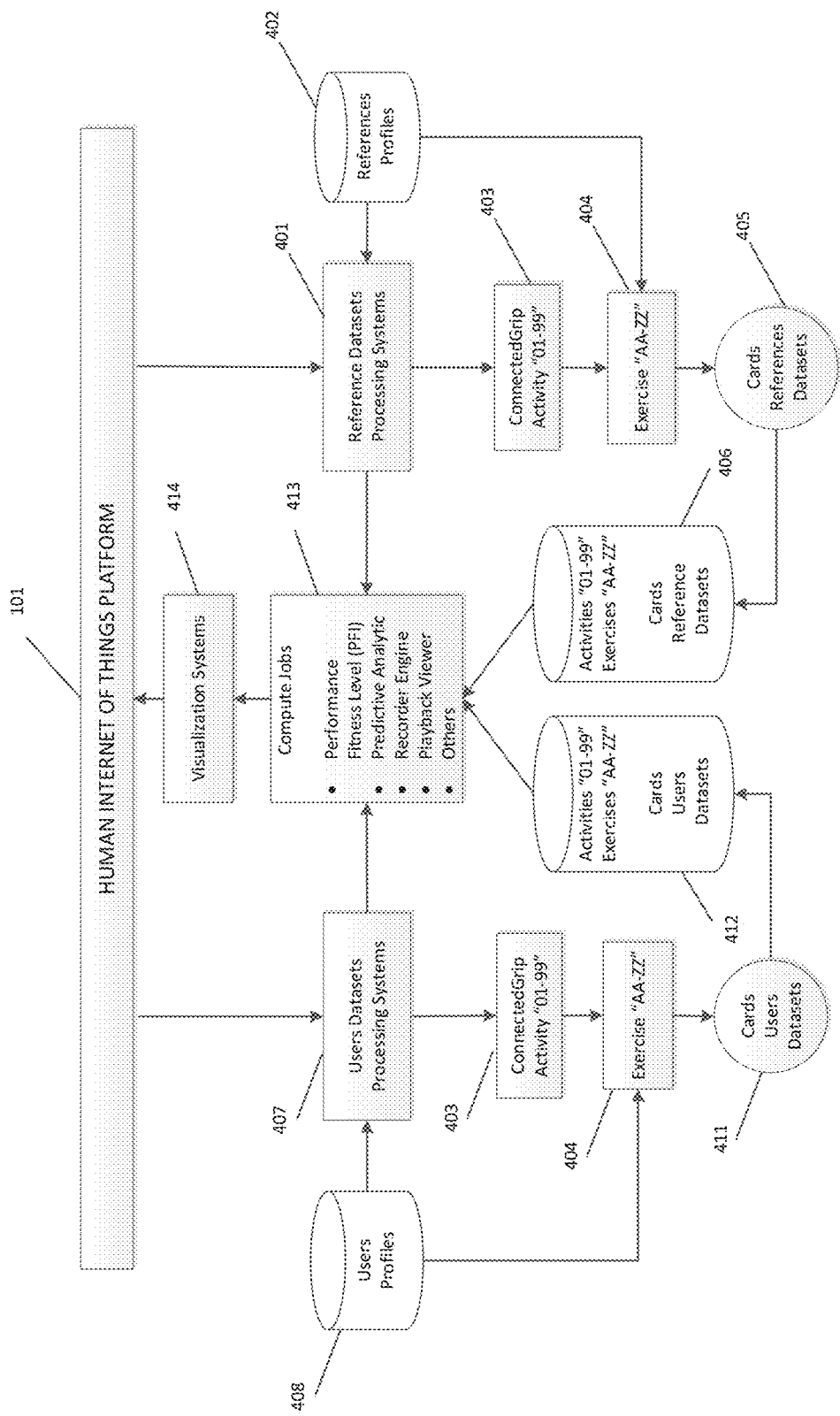
FIG. 4 illustrates the platform data modeling processes for managing consumer and reference activity card-based exercise datasets.

FIG. 4 illustrates the registered user datasets 407 and the reference user datasets systems 401 that manage the capture and processing of the card-based exercise 404 datasets categorized by activities 403.

The reference user datasets systems 401 manage the processing of the reference datasets 405 generated by reference users 402 of the platform services, such as trainers, coaches or activity experts, when performing specific connected grip exercises 404 within a particular set of activities 403, such as jump rope, golf, rowing or cycling.

The registered user datasets systems 407 manage the processing of the user datasets 411 from registered users 408 of the platform services when engaging with connected grip specific exercise 404 within a particular set of activities 403 such as jump rope, golf, rowing or cycling.

The platform compute jobs 413 is running the data analytic algorithms that are analyzing and correlating the incoming user datasets 412 to the related recorded reference datasets 406 in order to be able to compute information such as performance level and predictive performance level, based on the recording and historical analysis of the incoming user datasets.

The platform visualization systems 414 are processing the results of the computed jobs to build support for the data visualization that the platform applications and services depend upon.

Connected Grip Sensors Dataset

Connected grip embedded sensors are classified by their functions and typically include motion, physiology and environmental layers for examples. These 3 layers collectively define the dataset captured from each connected grip embedded sensors.

The motion layer typically includes a 9-axis accelerometer, gyroscope and compass that capture the motion data from a connected grip in a multi-dimensional physical space.

The environmental layer typically includes humidity, ambient light, ambient temperature and barometric pressure sensors that capture data of the physical environment around the connected grip.

The physiology layer typically includes grip pressure, body temperature, heart rate and pulse oximeter that collectively capture data about the physiology of the user while holding a connected grip apparatus in its left or right hand.

The following table represents a listing of the typical sensors and their respective classification layer which are embedded into a single connected grip. The sensors data are captured in real-time and uploaded to the paired mobile application and human internet of things platform. The resulting dataset is representative of the individual exercises performed over time by the user when holding a connected grip during a particular activity. Based on connected grip implementation, different numbers and configurations of sensors type and classification can be designed and implemented.

| Dataset | Sensors Type | Classification |
| --- | --- | --- |
| adc_4 | Grip Pressure 4/6 | Physiology |
| humidity | Humidity Factor | Environmental |
| acc_x | Accelerometer X | Motion |
| light | Ambient Light | Environmental |
| adc_3 | Grip Pressure 3/6 | Physiology |
| compass_x | Compass X | Motion |
| adc_6 | Grip Pressure 6/6 | Physiology |
| adc_5 | Grip Pressure 5/6 | Physiology |
| acc_z | Accelerometer Z | Motion |
| temperature | Body Temperature | Physiology |
| gyro_x | Gyroscope X | Motion |
| heartrate | Heartrate Sensor | Physiology |
| compass_y | Compass Y | Motion |
| adc_2 | Grip Pressure 2/6 | Physiology |
| acc_y | Accelerometer Y | Motion |
| object_temp | Ambient Temperature | Environmental |
| adc_1 | Grip Pressure 1/6 | Physiology |
| gyro_z | Gyroscope Z | Motion |
| spo2 | Pulse Oximeter | Physiology |
| air_pressure | Barometric Pressure | Environmental |
| gyro_y | Gyroscope Y | Motion |
| compass_z | Compass Z | Motion |
| galvanic | Galvanic Skin Response | Physiology |
| otherdata | Others | Classification |

In the above table example, the connected grip pressure sensors are organized as 6 distinct analog channels that measure the force applied by each fingers and palm area of the left or right hand of a registered user when holding and engaging with a connected grip. Based on connected grip implementation, different numbers and configurations of connected grip pressure channels can be designed and implemented.

Activities such as jump rope, elastic bands or rowing for examples are based on the simultaneous interaction with 2 connected grips and therefore any exercises within these activities typically generate 2 distinct datasets, one from the left-hand connected grip 103 and the other from the right-hand connected grip 201.

Connected Grip Accessory Universal Connector

The accessory universal connector 107 is used to attach and detach an optional accessory to a connected grip apparatus 107a.

The accessory universal connector includes a mechanical lock mechanism as well as a mechanical key which is unique to the accessory. An accessory 107a is attached to a connected grip 103 when being twisted clockwise into one end of a connected grip. Similarly, an accessory is being detached from a connected grip when being twisted counterclockwise.

The identification of a particular accessory is carried out by a set of magnets which are embedded into the accessory's universal connector and placed in preset locations which are unique to a specific type of accessory. When twisting the accessory universal connector 107, the location of its set of embedded magnets is detected and read by the connected grip built-in read switches, effectively detecting the type of accessory being attached to the connected grip. The connected grip embedded read switches, for detecting the accessory's magnets, are located on both ends of the connected grip to be able to detect accessories that require either one connection, such as a jump rope, or 2 connections such as elastic band for examples.

Based on connected grip implementation, different methods and configurations can be applied to attach and detect grip-based accessories, including the use of screws and electronics contacts for example, or other combinations of lock and release mechanisms that can be designed and implemented.

A. "Gym-Trainer-in-a-Bag" Connected Grips Bundle Activities

The "Gym-Trainer-in-a-Bag" is a bundle of 2 connected grips with multiple accessories such as Jump Rope, Elastic Bands, Dumbbells and Barbells. By attaching and detaching these accessories, the user is able to switch from a particular activity to the next, getting data captured continuously during each exercise.

The following is a list of the 5 typical activities that are provided and modeled from the "Gym-Trainer-in-a-Bag" bundle, as listed:

Grip Strength: Grip strength exercises do not require the use of any specific accessories or universal connector.

Elastic Bands: Most elastic band exercises require the use of 2 connected grips simultaneously. Both ends of the elastic band comes with 2 accessory universal connectors which can be attached and detached from their respective connected grip, with a total of 4 accessory universal connectors, 2 per connected grips, per elastic band strength. Alternatively, the elastic band can be attached and detached to a Y shaped soft connected grip with the 2 accessory universal connectors, providing for a mechanism to attach and detach any elastic bands from the market, with a total of 4 accessory universal connectors, 2 per connected grips, regardless of the choice of elastic band.

Jump Rope: Jump rope exercises require the use of 2 connected grips simultaneously. Both ends of the jump rope include 1 accessory universal connector which can be attached and detached from their respective connected grip, for a total of 2 accessory universal connectors, 1 per connected grip.

Dumbbells: Dumbbell exercises require the use of one or two connected grips. Each connected grip is connected to 2 separate dumbbells, one for each end of the connected grip. A dumbbell of a particular weight comes with 1 accessory universal connector to be used to attach and detach to one end of a connected grip.

Barbells: Barbells exercises require the use of 2 connected grips simultaneously. The barbell rod comes with an accessory universal connector on both ends to be attached and detached from the 2 connected grips. When used in conjunction with a set of dumbbells, each dumbbell comes with 1 accessory universal connector to be attached and detached from the other end of the connected grip-connected barbell rod.

Connected Grips—"Gym-Trainer-in-a-Bag" Activities Modeling and Visualization

Each of the "Gym-Trainer-in-a-Bag" activities is associated to a series of individual exercises, and their respective reference datasets, that can be performed, in any order, randomly or not, based on the user's fitness level, trainer's inputs or user's personal selection.

The analogy is similar to the distribution of a game of cards, with each card defined by a specific exercise. As in card games, there are multiple possible games, like "Solitary" or "Blackjack" for examples, designed with the same set of cards, but with different rules. Please refer to the "Gamification" Section J for more examples.

In order to provide useful and actionable feedback to the registered users of connected grip products, the data modeling process is computing real-time graphical representations of the power cost equivalent resulting from the exercises performed by a particular registered user, expressed as the "Performance Fitness Index" or PFI, as compared to baseline and reference models, and computed as an alternative to the standard MET referential, see next section.

In addition, the human internet of things platform computes Multi-Dimensional Information Modeling (MDIM) for registered users of the platform. A MDIM quantifies a registered user's overall engagement, performance and achievements from the aggregation of multiple datasets categorized by dimension classifications, such as "Motion, "Physiology" and Environment", "Diet" and "Social" among others. Refer to Section on MDIM for more details.

MET Referential

The Metabolic Equivalent of Task (MET), or simply metabolic equivalent, is a physiological measure expressing the power cost of physical activities.

MET can be thought of as an index of the intensity of activities: for example, an activity with a MET value of 2, such as walking at a slow pace requires twice the power that an average person consumes At-Rest.

MET is defined as the ratio of metabolic rate during a specific physical activity to a reference metabolic rate, set by convention to an oxygen uptake of 3.5 ml per kilogram per minute. For a 60 kg person it is 210 ml O2/min. The amount of power depends upon the type of fuel being oxidized (carbohydrate, fat, protein), but a good average figure is 4.82 kcal per liter of oxygen consumed.

Using this figure, a 60 kg person has a typical power output of:

Power output (1 MET)=(0.21 L O2/min)(4.82 kcal/L O2)=1.01 kcal/min

Performance Fitness Index—PFI

The "Performance Fitness Index" (PFI) is a personalized MET proprietary computation of the relative power cost a particular registered user is spending while a specific connected grip activity-based exercise is being performed compared to a "At-Rest" condition.

By contrast to the "Metabolic Equivalent of Task" (MET) computation, see pervious section, which is using a preset generic estimate of the amount of power a person is using while "At-Rest", the PFI is computed using actualized "At-Rest" power references based on the profile of the registered user, including for instance its age, weight, height, gender and level of fitness among other data, and as adjusted overtime based on its historical activities.

When leveraging the connected grip array of sensors, including its pulse oximeter and heart rate sensors, the PFI is establishing a personalized reference "At-Rest" value for each registered user, effectively providing for a more accurate computation of the relative power cost of physical smart grip activities and their individual exercises.

For reference, the published MET values for specific activities are experimentally and statistically derived from a sample of persons and are only indicative averages. Specifically, the level of intensity at which a specific person performs a specific physical activity, such as the pace of walking or the speed of running for examples deviates from the representative experimental conditions used for the calculation of the standard MET values. In addition, the actual power expenditure and the "Resting Metabolic Rate" RMR differ according to the person's overall fitness level and other factors.

For example, the "At-Rest" PFI is defined as the metabolic rate computed during a specific "At-Rest" activity-based exercise, by measuring the "At-Rest" metabolic rate of a registered user using the available datasets classification. By contrast to the MET determination, the oxygen uptake, which is derived from the pulse oximeter sensor datasets, is only one of the datasets captured from the connected grip sensors as the PFI gets instead computed from multiple datasets including registered user profile, physiology and environment captured from specific smart-grip activity-based exercises, such as "At-Rest" or "Jump Rope—Double Jump".

In one embodiment, the PFI generation module generates a PFI by a weighted sum of the scored user activity-based exercise data. For example, given a specific activity-based exercise category $A_i$, a user profile scores $U_i$, a motion category score $M_i$, environment category scores $E_j$, physiology category scores $P_k$, each with a respective weight W, within a time duration T, the PFI generation module generates a personalized PFI by the equation:

$$\text{PFI(UserID)}\text{"}A_i\text{"}=[\Sigma(U_j \times W_{Uj})+\Sigma(M_k \times W_{Mk})+(E_k \times W_{Ek})+(P_j \times W_{Pl})] \times T$$

For example, when calculating the "At-Rest" activity-based exercise $A_i$, the motion sensors datasets are monitoring that the registered user is resting, preferably in a standing position and without moving for a period of time T corresponding to the "At-Rest" measurement.

Similarly, the physiology sensors datasets are capturing the pressure applied by the registered user's hands grips, as well as its average heart rate, pulse oximetry and body temperature among others during the duration of the "At-Rest" measurement while the environment sensors datasets, such as barometric pressure and humidity level among others are capturing the environmental conditions which may condition the "At-Rest" measurement.

Derived from the same process, the PFI of any activity-based exercises for a particular registered user gets computed from the captured connected grip datasets while performing activity-based exercises which are already modeled in the overall platform database.

In another embodiment, the PFI generation module generates a PFI by averaging the weighted sum of the scored activity-based exercise data between the 2 captured datasets corresponding to the left and right connected grips.

$$\text{PFI(UserID)}\text{"}A_i\text{"}=[\text{Left}[\text{PFI(UserID)}\text{"}A_i\text{"}]+\text{Right}[\text{PFI(UserID)}\text{"}A_i\text{"}]]/2$$

In yet another embodiment, the PFI generation module generates a PFI by weighting differently the left and right captured datasets for a particular activity-based exercise.

$$\text{PFI(UserID)}\text{"}A_i\text{"}=[\text{Left}[\text{PFI(UserID)}\text{"}A_i\text{"} \times W_L]+\text{Right}[\text{PFI(UserID)}\text{"}A_i\text{"} \times W_R]]/2$$

For instance, a registered user performing a specific type of activity-based exercise, such as jump rope "double jump" for example, is going to consume a certain amount of oxygen within a particular heartbeat range, as captured by the physiology connected grip sensors while producing a particular amount of motion as captured by the motion sensors, all within a particular environment, as captured by the environment sensors.

By factoring that a particular registered user has a weak side and a strong side, the computed PFI is providing actionable feedback to that user to identify its weak side from strong side per activity-based exercise in order to train for the measured differences in performance and compensate overtime.

Body Activity Relative Power Computation

The following table gives a comparison of relative power costs METS of an average person from performing some common activities and the personalized computed PFI which is the result of a computation by the platform based on the profile of the registered user when exercising with connected grip-based products.

Additional connected grips activities, such as golf, tennis, ping pong or rowing for examples can be added to the following table, expanding the list to include any connected grip based products and their specific exercises.

| Physical activities | MET (Statistical) | Personalized PFI |
|---|---|---|
| Light intensity activities | <3 | |
| Watching television | 1.0 | Computed |
| Writing, desk work, typing | 1.5 | Computed |
| Walking, 1.7 mph (2.7 km/h), level ground, strolling, very slow | 2.3 | Computed |
| Walking, 2.5 mph (4 km/h) | 2.9 | Computed |
| Moderate intensity activities | 3 to 6 | |
| Bicycling, stationary, 50 watts, very light effort | 3.0 | Computed |
| Walking 3.0 mph (4.8 km/h) | 3.3 | Computed |
| Calisthenics, home exercise, light or moderate effort, general | 3.5 | Computed |
| Walking 3.4 mph (5.5 km/h) | 3.6 | Computed |
| Bicycling, <10 mph (16 km/h), leisure, to work or for pleasure | 4.0 | Computed |
| Bicycling, stationary, 100 watts, light effort | 5.5 | Computed |
| Vigorous intensity activities | >6 | |
| Jogging | 7.0 | Computed |
| Calisthenics (pushups, situps, pullups, jumping jacks) | 8.0 | Computed |
| Running | 8.0 | Computed |
| Elastic bands (factored by type of elastic bands, intensity) | N/A | Computed |
| Jump Rope (factored by type of ropes, intensity) | N/A | Computed |
| Weights, Barbells (factored by actual weights, intensity) | N/A | Computed |

Heart Rate Optimum Range

Tracking and monitoring heart rate is an important and often critical function of any physical activities.

For instance, fat burning occurs when a registered user elevates its heart rate to around 60% to 80% of its maximum heart rate. By leveraging the heart rate sensors embedded in both left and right connected grips, the platform computes an approximation of the registered user maximum heart rate based on the following formula:

220 bpm−(age of registered user "A")=maximum bpm

Therefore, the fat burning range (registered user "A")= (max bpm×0.6) to (max bpm×0.8)

Any smart grip exercises which elevate the registered user "A" heart rate to the appropriate bpm for a sustainable period of time, such as an hour or more, represent a great way to burn fat.

Because the left and right connected grips include both the same array of sensors, the monitoring and tracking of the registered user heart rate is derived from the capture of both the left and right side of the body, providing for more accurate readings of the heart rate, and of the optimum range for that registered user.

For example, jump rope exercises are typically used for cardio exercises, as quick skipping is pushing heart rate above 80% max bpm. By skipping slow enough while sustaining the exercise long enough, jump rope makes for a great fat burner set of fitness exercises.

By computing personalized PFI with emphasis on optimum heart rate range, the platform provides real-time actionable information to its registered users at any point prior, during and after any connected grip exercises.

Activity Recorder and Viewer

The Activity recorder is a modern representation of a written log book. It is recording in real-time the individual exercises being performed by the connected grip user, categorized by type of activities, such as jump rope or elastic bands, and specific individual exercises, such as "single jump" or "front squat" for examples.

The Activity recorder provides access to past playlists through a calendar view of past activities and exercises, as a way to visualize, playback and analyze historical activities.

For instance, a 30-day fitness program can be displayed as a graphic representation of 30 tiles, each tile corresponding to the past, current or future listing and description of performed playlist of individual exercises grouped by activities, with their specific PFI and all captured sensors data. Refer to following sections on activities playlists generation.

In addition, some components of connected grips apparatus I/O systems, such as the built-in webcam for example, may be used as a method to capture certain aspects of the user's engagement with connected grips activities.

For instance, the built-in webcam may capture the body posture, such as the range of motion or a straight back posture, for examples, of a registered user when performing a particular jump rope, rowing or cycling activity-based exercises, hence providing additional information to the platform when modeling such activities and comparing with the posture of other registered users or instructors.

Separately, the built-in webcam may be used to capture the identity of the user performing these activity-based exercises, hence providing a method for matching a particular individual to the profile of a registered user, refer to the section J on universal login.

Activity Playback and Viewer

Similar to video or audio playback, past activities and exercises when selected are visualized again by playing their recorded data, providing for a review of possible events that happened during each recorded physical session.

By calling functions such as "Play", "Pause", "Forward" or "Backward", "Next" or "Previous", a registered user is able to navigate quickly within any recorded activities and exercises in order to review and focus on specific events along with their recorded sensors data.

For instance, an event such as "drop of power output", as visualized by the computed PFI, can be analyzed by reviewing the recorded sensors data prior to the event happening, providing clues to the registered user as to why the power drop happened.

Because the playback function can be shared between registered users, granting permissions, the recorded activities and their exercises, along with its sensors data, can be analyzed or commented by registered users who may have more insights as to the reported events, such as professional trainers or coaches, for examples.

Similarly, the platform compiles a Library of Events, such as "heart rate too high (slow down)", "heart rate too low (for burning fat)" "power level too low (for this exercise)", "power level average (for this exercise)" and "power level too high (for this exercise)" for examples that are each indicative of the performance level provided by a registered user while performing connected grip activities and their exercises.

Activity Feedback

There are several types of feedback that are provided to the registered user while performing a particular exercise, including graphic visualization, application voice-over, vibration and LEDs.

The graphic visualization consists of displaying multiple layers of data onto the mobile application running on the paired connected device of the registered user.

The top information layer typically includes the card equivalent representation of the exercise, such as its name and description, the ordering of all the exercise cards within a predefined playlist (if available), along with the real-time computed PFI, heart rate range (as an average from the left and right connected grips), pulse oximeter level (as an average from the left and right connected grips), body temperature (as an average from the left and right connected grips), starting and ending time, for examples.

Additional information layers typically include "Environmental", as captured and visualized from the ambient temperature, barometric pressure, humidity level and ambient light sensors, "Motion", as captured and visualized separately from the left and right 9-axis accelerometers, gyroscope, compass sensors and built-in webcam when available, "Team", as captured and visualized from exercises performed synchronously with one or more other registered users if available, "Communities", as captured by from the online exercises performed by the registered user social connections if available.

Other information layers can be added at the platform level and visualized as needed, based on $3^{rd}$ party data integration, such as "Dietary", such as food and water ingested prior and after activities or exercises, "Weather", such as weather forecasts, "Competition", such as events published by the platform to invite registered users into friendly or competitive activity-based events "Professionals", such as a listing of ranked professionals that can provide direct assistance and recommendation for the type of exercises being performed, as well as other information layers that can be aggregated and managed by the human internet of things platform.

The application voice over is used to as a way to communicate with the registered user both during and between activities or individual exercises.

Voice-over during an exercise includes specific real-time events that inform or guide the registered user about its performance. A partial listing includes time related information, such as "duration", "remaining time", PFI related information, such as "great intensity", "average intensity", "minimum intensity", warning related information, such as "heart rate too high", "heart rate below optimum range", "heart rate above optimum range", "body temperature too high" or "incorrect body posture" for examples.

Voice-over between exercises includes specific events that inform or guide the registered user about upcoming exercises within a predefined playlist. A partial listing includes the "name and description" of the upcoming exercise as defined by the playlist, an optional "rest period" to perform before the start of the next exercise, or a generic comment to encourage and motivate the registered user, such as "great work", "keep going", "last one", "almost done", "take a 5 minutes break", "straighten your back" or "10 more minutes", for examples.

Vibrations are used by the platform and mobile application to provide feedback to registered user while holding connected grips in their left and right hands via their embedded programmable vibrators.

Based on implementation, the duration (time), frequency (pattern) and location (left, right, both) of the vibrations are mapped to a library of events to inform the registered user during its exercises, without necessarily having to refer to the paired mobile application for inputs.

LEDs are used by the platform and mobile application to provide visual feedback to registered user while holding connected grips in their left and right hands via their embedded programmable LEDs.

Based on implementation, the duration (time), frequency (pattern) and location (left, right, both) of the LEDs are mapped to a library of visual events to inform the registered user during its exercises without necessarily having to refer to the paired mobile application for inputs. LEDs can also be paired with vibration to reinforce specific events that require immediate attention, such as "heart rate above optimum range" or "body temperature too high" for examples, enabling the platform application to force the insertion of resting periods, pause or cancel the delivery of the running playlist of exercises.

Performance Predictor

The Performance Predictor is calculated based on previously recorded exercises and is designed to provide an estimate of future performance improvement by extrapolating the delta from similar exercises overtime.

For instance, the Performance Predictor is estimating the PFI of upcoming exercises from previously recorded PFI exercises or playlists. As a registered user repeats the same set of exercises, the PFI for these exercises are typically increasing both individually and collectively given the repetition overtime.

For example, a detected improvement of 3% between 2 consecutive recorded similar exercises or playlist can be used to extrapolate a similar improvement for the upcoming same exercises or playlist.

Similarly, the performance predictor has access to previously computed statistical PFIs that correspond to the profiles of other registered users similar to the registered user, as correlated by age, gender, weight, height and fitness level among other data, providing the performance predictor with actionable reference data when computing the prediction overtime.

B. Grip Strength Connected Grips Training

Grip Strength Card Reference Datasets

The grip strength typically reflects the overall muscle health and help predict how long someone will live as grip strength tends to decrease with aging, especially in women. A woman in her early 30s averages grip strength of about 70 pounds, but once she hits her early 80s, that strength decreases by nearly half. As seniors lose grip strength, they lose independence and have problems opening jars, bottles, refrigerators or standard door knobs, for examples.

Grip strength is defined as a simple exercise which is safe for any adults or seniors at any age and any grip strength which can be done while watching television or sitting at a desk, effectively from a light activity PFI.

Grip strength basic card reference datasets are determined from the repetitive squeezing of one, or two, connected grips by a sample of reference users categorized from gender, age, weight and fitness level specifically, as captured from light activities PFI.

Grip strength extended card reference datasets may be determined by using left, right, male, female, under 30, 30 to 50, 50 to 70, above 70, finger-level strength as additional reference data points, providing for a comprehensive set of possible exercises.

Grip Strength—Training Exercise Playlist

A grip strength training exercise is defined as a playlist of grip strength card reference datasets organized in a linear fashion by the platform mobile application. This playlist is presented to the registered user who exercises against it during the time allocated for that exercise.

Playlists are assembled dynamically based on the profile and historical data of the user. Playlists can also be customized by the user or trainer before the start of a fitness session.

The related personal fitness index is computed for these exercises from all registered users, including reference and consumers.

Optional rest periods between grip strength exercises can be added preventively by the platform application based on the profile of the registered user and captured datasets. Rest periods can also be added manually by the registered user or its selected trainer or coach.

Grip Strength—Playlist Example

Based on, for example, a male senior card referenced datasets, the following playlist will strengthen the registered user left and right hands for 3 seconds each, with this 30 seconds long grip strength workout.

Minutes 0:00-0:03: Male Senior—Reference Left Hand Squeeze "RLHS"
Minutes 0:03-0:06: Male Senior—Reference Right Hand Squeeze "RRHS"
Minutes 0:06-0:09: Male Senior—Reference Left Hand Squeeze "RLHS"
Minutes 0:09-0:12: Male Senior—Reference Right Hand Squeeze "RRHS"
Minutes 0:12-0:15: Male Senior—Reference Left Hand Squeeze "RRHS"
Minutes 0:15-0:18: Male Senior—Reference Left Hand Squeeze "RLHS"
Minutes 0:18-0:21: Male Senior—Reference Right Hand Squeeze "RRHS"
Minutes 0:21-0:24: Male Senior—Reference Left Hand Squeeze "RLHS"
Minutes 0:24-0:27: Male Senior—Reference Right Hand Squeeze "RRHS"
Minutes 0:27-0:30: Male Senior—Reference Left Hand Squeeze "RLHS"

Grip Strength—Training Example

The 30 seconds grip strength training is defined as an activity session with a set of inherited properties, including userID, session #, card reference datasets and captured userDataset # corresponding to the playlist exercises within the session.

A Male Senior "MS" connected grip user going through the previous grip strength 30 seconds playlist generates its own dataset for each of the exercises assembled into the playlist, exercises that are correlated against the male senior referenced datasets, as listed in the following table.

| Session | Time | Reference Datasets | UserID# Datasets | PFI |
| --- | --- | --- | --- | --- |
| #1 | T0:00-0:03 | MS-RLHS | MS-ULHS | Computed |
| #1 | T0:03-0:06 | MS-RRHS | MS-URHS | Computed |
| #1 | T0:06-0:09 | MS-RLHS | MS-ULHS | Computed |
| #1 | T0:09-0:12 | MS-RRHS | MS-URHS | Computed |
| #1 | T0:12-0:15 | MS-RLHS | MS-ULHS | Computed |
| #1 | T0:15-0:18 | MS-RRHS | MS-URHS | Computed |
| #1 | T0:18-0:21 | MS-RLHS | MS-ULHS | Computed |
| #1 | T0:21-0:24 | MS-RRHS | MS-URHS | Computed |
| #1 | T0:24-0:27 | MS-RLHS | MS-ULHS | Computed |
| #1 | T0:27-0:30 | MS-RRHS | MS-URHS | Computed |

In addition, the previously recorded sessions for that userID # dataset can be compared with the most recent session to provide on-going recommendation and guidance by the human internet of thigs platform when assembling its next personalized playlist.

C. Jump Rope Connected Grips Training

Jump Rope Card Reference Datasets

The following is a sample list of distinct jump rope connected grip exercises and card reference datasets, including "Single Jump", "Figure Eight", "Step Touch", "Front-Back", "Slalom", "Double Jump", "Jumping Back" and "Running".

The listing of jump rope connected grip exercises is not limited to these 8 card reference datasets but can be extended by the reference users, or non-reference users, who can post new reference exercises and their related card reference datasets based on their own experience and fitness level.

The card reference "Single Jump" dataset is identified by its unique code, such as "RSJ" for example, and corresponds to a particular sequence of motion that characterizes this particular exercise, as described thereafter:

Jump over the rope with feet together, one jump per turn

The PFI is computed for this particular "RSJ" exercise from the one or several reference users and then used as comparison to the PFIs computed for this same "RSJ" by the non-reference users.

The card reference "Figure Eight" dataset is identified by its unique code, such as "RFE" for example, and corresponds to a particular sequence of motion that characterizes this particular exercise, as described thereafter:

Stand with feet shoulder-width apart, grasping jump rope connected grips together with both hands in front of body Trace a sideways figure eight, moving from right shoulder to left hip, then left shoulder to right hip Shift weight from right to left foot as you move your arms across your body The PFI is computed for this particular "RFE" exercise from the one or several reference users and then used as comparison to the PFIs computed for this same "RFE" by the non-reference users.

The card reference "Step Touch" dataset is identified by its unique code, such as "RST", and corresponds to a particular sequence of motion that characterizes this particular exercise, as described thereafter:

Holding connected grips together, swing rope to the left and turn twice in a circular motion while stepping to the left and tap right toes by left heel Repeat to the right The PFI is computed for this particular "RST" exercise from the one or several reference users and then used as comparison to the PFIs computed for this same "RST" by the non-reference users.

The card reference "Front-Back" dataset is identified by its unique code, such as "RFB", and corresponds to a particular sequence of motion that characterizes this particular exercise, as described thereafter:

Jump up with feet together, moving 6 inches forward over the rope

On the next turn, jump back 6 inches

Continue alternating, jumping once per turn

The PFI is computed for this particular "RFB" exercise from the one or several reference users and then used as comparison to the PFIs computed for this same "RFB" by the non-reference users.

The card reference "Slalom" is identified by its unique code, such as "RSL", and corresponds to a particular sequence of motion that characterizes this particular exercise, as described thereafter:

Jump over the rope 6 inches to the right, landing on both feet

On the next turn, jump 6 inches to the left

Keep feet together and continue alternating, jumping once per turn

The PFI is computed for this particular "RSL" exercise from the one or several reference users and then used as comparison to the PFIs computed for this same "RSL" by the non-reference users.

The card reference "Double Jump" is identified by its unique code, such as "RDJ", and corresponds to a particular sequence of motion that characterizes this particular exercise, as described thereafter:

Jump high enough to pass the rope under both feet twice before landing

The PFI is computed for this particular "RDJ" exercise from the one or several reference users and then used as comparison to the PFIs computed for this same "RDJ" by the non-reference users.

The card reference "Jumping Back" is identified by its unique code, such as RJB", and corresponds to a particular sequence of motion that characterizes this particular exercise, as described thereafter:

Jump over the rope and land with feet wider than hip-width apart

On next jump, land with feet together

The PFI is computed for this particular "RJB" exercise from the one or several reference users and then used as comparison to the PFIs computed for this same "RJB" by the non-reference users.

The card reference "Running" is identified by its unique code, such as "RRU", and corresponds to the particular sequence of motion that characterizes this particular exercise, as described thereafter:

Run in place while turning the rope

The rope should pass under one foot at a time

The PFI is computed for this particular "RRU" exercise from the one or several reference users and then used as comparison to the PFIs computed for this same "RRU" by the non-reference users.

Jump Rope Extended Card Reference Datasets

The above basic card reference datasets can be extended by considering jump rope types, gender and fitness level, as captured from the reference user's profile. For instance, male, female, beginner, intermediate, advanced, professional represent natural predictable variations of the reference user's datasets, with each reference card having its computed PFI, as listed thereafter.

JumpRope #-Male-Beginner (RSJ-RFE-RST-RFB-RSL-RDJ-RJB-RRU)

JumpRope #-Male-Intermediate (RSJ-RFE-RFB-RSL-RDJ-RJB-RRU)

JumpRope #-Male-Advanced (RSJ-RFE-RST-RFB-RSL-RDJ-RJB-RRU)

JumpRope #-Male-Professional (RSJ-RFE-RST-RFB-RSL-RDJ-RJB-RRU)

JumpRope #-Female-Beginner (RSJ-RFE-RST-RFB-RSL-RDJ-RJB-RRU)

JumpRope #-Female-Intermediate (RSJ-RFE-RST-RFB-RSL-RDJ-RJB-RRU)

JumpRope #-Female-Advanced (RSJ-RFE-RST-RFB-RSL-RDJ-RJB-RRU)

JumpRope #-Female-Professional (RSJ-RFE-RST-RFB-RSL-RDJ-RJB-RRU)

Connected Grips Jump Rope Training Playlist

A user practicing jump rope is going to jump a minimum of 1 to 2 inches off the floor in order to give the rope enough clearance to slip under the feet. By keeping the elbows close to the sides when turning the rope, the movement comes from the wrists and forearms and not the shoulders, with all motion captured from both left and right connected grips sensors.

A connected grip jump rope training is defined by a playlist of jump rope card reference datasets which are organized in a linear fashion by the human internet of things platform application. This playlist is assembled and presented to the register user who wants to follow the order of the playlist during the time allocated for these exercises.

The playlists are assembled dynamically based on the profile and historical data of the registered user, effectively taken into consideration its gender, age, weight and height for examples coupled with its recorded level of fitness overtime as correlated against existing reference datasets.

Playlists are also customizable by the registered user, or its selected professional trainers, coach or mentors, before the start of a new physical session, providing a mechanism for customizing the computed playlist proposed by the human internet of things platform by for example changing the time of a particular exercise within the playlist or the ordering of the proposed exercises.

The PFI of the overall physical session is then computed from the aggregation of all individual exercise listed from the compiled playlist, and its value compared to the PFIs of both historical and reference datasets, providing direct qualitative and quantitative feedback to the registered user as to its level of performance during the playlist.

Based on the fitness profile of the registered user, rest periods between consecutive exercises can be added preventively to the compiled playlist by the platform application, providing the registered user with time period to recover and adjust prior to the next exercise on that playlist.

Rest periods can also be added dynamically by the platform based on the monitoring of the key sensor data within the datasets captured from the registered user while engaging in the playlist, such as heart rate for example.

Jump Rope Playlist Example

The following jump rope playlist illustrates an example of multiple card-based exercises that a connected grip registered user can use to burn calories in a short period of time while developing shoulders, chest, arms, and legs.

Minutes 0:00-1:00: Figure Eight—RFE
Minutes 1:00-2:00: Single Jump—RSJ
Minutes 2:00-2:30: Step Touch—RST
Minutes 2:30-3:30: Front-Back—RFB
Minutes 3:30-4:00: Figure Eight—RFE
Minutes 4:00-5:00: Slalom—RSL
Minutes 5:00-5:30: Step Touch—RST
Minutes 5:30-6:00: Double Jump—RDJ
Minutes 6:00-6:30: Figure Eight—RFE
Minutes 6:30-7:00: Jumping Back—RJB
Minutes 7:00-9:00: Running—RRU
Minutes 9:00-10:00: Step Touch—RST Jump Rope Fitness Training Example The previous jump rope playlist is defined as an activity session with a set of inherited properties, including UserID, Session #, Reference Datasets along with the captured UserDataset # corresponding to the playlist exercises within the jump rope session.

A Male Beginner "MB" connected grip registered user going through the above jump rope activity session generates its own dataset for each of the card-based exercises assembled into the generated playlist, exercises that are correlated against available male beginner referenced datasets.

| Session | Time | Reference Datasets | UserID# Datasets | PFI |
|---|---|---|---|---|
| #1 | T0:00-1:00 | MB-RFE | UFE | Computed |
| #1 | T1:00-2:00 | MB-RSJ | USJ | Computed |
| #1 | T2:00-2:30 | MB-RST | UST | Computed |
| #1 | T2:30-3:30 | MB-RFB | UFB | Computed |
| #1 | T3:30-4:00 | MB-RFE | UFE | Computed |
| #1 | T4:00-5:00 | MB-RSL | USL | Computed |
| #1 | T5:00-5:30 | MB-RST | UST | Computed |
| #1 | T5:30-6:00 | MB-RDJ | URD | Computed |
| #1 | T6:00-6:30 | MB-RFE | UFE | Computed |
| #1 | T6:30-7:00 | MB-RJB | UJB | Computed |
| #1 | T7:00-9:00 | MB-RRU | URU | Computed |
| #1 | T9:00-10:00 | MB-RST | UST | Computed |

In addition, the previously recorded activity sessions for that UserID # Dataset are compared with the most recent session by the platform analytic to adjust the next activity session exercises and provide on-going recommendations to the registered user based on fitness profile and preferences.

D. Elastic Bands Connected Grips Training

Elastic Bands Card Reference Datasets

The following is a sample list of distinct elastic band exercises and their reference datasets, categorized by "Lower Body—Front Squat", "Back Exercises—Bend Over Row", "Chest Exercises—Incline Chest Press", "Shoulder Exercises—Forward Raise", "Arms Exercises—Standing Biceps Curl" and "Core Exercises—Russian Twist". By definition, elastic bands come in different types, from highly stretchable to heavy-duty strength. As such, the modeling is based on one, or more, types of bands.

The above listing of elastic bands connected grip exercises is not limited to these card reference datasets but can be extended by the reference users, or non-reference users, who can post new reference exercises and their related card reference datasets based on their own experience and fitness level.

Lower Body

The card reference "Front Squat" dataset is identified by its unique code, such as "RFS" for example, and corresponds to the particular sequence of motion that characterizes this particular exercise, as described thereafter:

Stand on band with feet slightly wider than shoulder width. Holding a connected grip in each hand, bring the top of the band over each shoulder. Sit straight down, chest up, abs firm, pressing knees out over toes. Rise back up to start position.

The PFI is computed for this particular "RFS" exercise, based on one or more types of elastic bands, from the one or several reference users and then used as comparison to the PFIs computed for this same "RFS" by the non-reference users.

Back Exercises

The card reference "Bend Over Row" dataset is identified by its unique code, such as "RBOR" for example, and corresponds to the particular sequence of motion that characterizes this particular exercise, as described thereafter:

Stand over the center of the band with feet shoulder-width apart. Bend slightly at the knees and hinge at the waist, keeping the hips back. Grasp each connected grip with hands facing the outside of the knees. With elbows bent, pull the band up toward the hips, squeezing the shoulder blades together until the elbows form a 90-degree angle.

The PFI is computed for this particular "RBOR" exercise, based on one or more types of elastic bands, from the one or several reference users and then used as comparison to the PFIs computed for this same "RBOR" by the non-reference users.

Chest Exercises

The card reference "Incline Chest Press" dataset is identified by its unique code, such as "RICP" for example, and corresponds to the particular sequence of motion that characterizes this particular exercise, as described thereafter:

In a right forward lunge position, place the middle of your band beneath your back foot. Grabbing a connected grip in each hand, bring the band to shoulder level. Press the bands upward straight over the chest like a rainbow until the arms fully extend.

The PFI is computed for this particular "RICP" exercise, based on one or more types of elastic bands, from the one or several reference users and then used as comparison to the PFIs computed for this same "RICP" by the non-reference users.

Shoulder Exercises

The card reference "Forward Raise" dataset is identified by its unique code, such as "RFSR" for example, and corresponds to the particular sequence of motion that characterizes this particular exercise, as described thereafter:

To hit the front of the shoulders, stand on the middle of the band with feet shoulder-width apart and grip each connected grip at the sides with palms facing in. Next, without locking the elbows, bring the right arm straight out in front of the body to shoulder height.

The PFI is computed for this particular "RFR" exercise, based on one or more types of elastic bands, from the one or several reference users and then used as comparison to the PFIs computed for this same "RFR" by the non-reference users.

Arms Exercises

The card reference "Standing Biceps Curl" dataset is identified by its unique code, such as "RSBC" for example, and corresponds to the particular sequence of motion that characterizes this particular exercise, as described thereafter:

Stand with feet shoulder-width apart with feet placed over the middle of the band. Grab a connected grip in each hand, starting with the arms down at the sides. With palms facing in front of the body, pull the arms toward the shoulders by bending at the elbow until getting a good bicep contraction.

The PFI is computed for this particular "RSBC" exercise, based on one or more types of elastic bands, from the one or several reference users and then used as comparison to the PFIs computed for this same "RSBC" by the non-reference users.

Core Exercises

The card reference "Russian Twist" dataset is identified by its unique code, such as "RRT" for example, and corresponds to the particular sequence of motion that characterizes this particular exercise, as described thereafter:

Sit on the floor with legs extended, wrapping the center of the band around the bottom of the feet. Hold the free ends in each hand. Slightly bend the knees, keeping feet on the floor, and lean back at a 45-degree angle. Rotate the band right by bringing the left hand across the body and the right hand down by the right hip. Contracting the oblique muscles, bring the band toward the right hip while keeping the middle and low back neutral. Return to starting position and rotate left then right.

The PFI is computed for this particular "RRT" exercise, based on one or more types of elastic bands, from the one or several reference users and then used as comparison to the PFIs computed for this same "RRT" by the non-reference users.

Elastic Band Extended Reference Datasets

The above basic reference datasets are extended by considering elastic band strength, gender and fitness level. For instance, male, female, beginner, intermediate, advanced, professional represent natural variations of the reference datasets, as listed, each reference with its own computed PFI, as listed thereafter:

ElasticBand #-Male-Beginner (RFS-RBOR-RICP-RFR-RSBC-RRT)
ElasticBand #-Male-Intermediate (RFS-RBOR-RICP-RFR-RSBC-RRT)
ElasticBand #-Male-Advanced (RFS-RBOR-RICP-RFR-RSBC-RRT)
ElasticBand #-Male-Professional (RFS-RBOR-RICP-RFR-RSBC-RRT)
ElasticBand #-Female-Beginner (RFS-RBOR-RICP-RFR-RSBC-RRT)
ElasticBand #-Female-Intermediate (RFS-RBOR-RICP-RFR-RSBC-RRT)
ElasticBand #-Female-Advanced (RFS-RBOR-RICP-RFR-RSBC-RRT)
ElasticBand #-Female-Professional (RFS-RBOR-RICP-RFR-RSBC-RRT)

Elastic Band Training Playlist

A connected grip elastic band training is defined by a playlist of elastic band card reference datasets, based on a particular type of elastic band, which are organized in a linear fashion by the human internet of things platform application. This playlist is assembled and presented to the register user who wants to follow the order of the playlist during the time allocated for these exercises.

The playlists are assembled dynamically based on the profile and historical data of the registered user, effectively taken into consideration its gender, age, weight and height for examples coupled with its recorded level of fitness overtime as correlated against existing reference datasets.

Playlists are also customizable by the registered user, or its selected professional trainers, coach or mentors, before the start of a new physical session, providing a mechanism for customizing the computed playlist proposed by the human internet of things platform by for example changing the time of a particular exercise within the playlist or the ordering of the proposed exercises.

The PFI of the overall physical session is then computed from the aggregation of all individual exercise listed from the compiled playlist, and its value compared to the PFIs of both historical and reference datasets, providing direct qualitative and quantitative feedback to the registered user as to its level of performance during the playlist.

Based on the fitness profile of the registered user, rest periods between consecutive exercises can be added preventively to the compiled playlist by the platform application, providing the registered user with time period to recover and adjust prior to the next exercise on that playlist.

Rest periods can also be added dynamically by the platform based on the monitoring of the key sensor data within the datasets captured from the registered user while engaging in the playlist, such as heart rate for example.

Elastic Band Playlist Example

A connected grip registered user is going to provide a high PFI level in a short period of time with this elastic band playlist example, as listed thereafter:

Minutes 0:00-1:00: Front Squat—RFS
Minutes 1:00-2:00: Bend Over Row—RBOR
Minutes 2:00-3:00: Incline Chest Press—RICP
Minutes 3:00-4:00: Forward Raise—RFR
Minutes 4:00-5:00: Standing Biceps Curl—RSBC
Minutes 5:00-6:00: Russian Twist—RRT Elastic Band Fitness Training Example The above elastic band playlist example is defined as an activity session with a set of inherited properties, including UserID, Session #, Reference Datasets along with the captured UserDataset # corresponding to the playlist exercises within the activity session.

A Female Beginner "FB" connected grip registered user going through the above elastic band training generates its own dataset for each of the exercises assembled into the generated playlist, exercises that are correlated individually and aggregated overall against recorded female beginner referenced datasets.

| Session | Time | Reference Datasets | UserID# Datasets | PFI |
|---|---|---|---|---|
| #1 | T0:00-1:00 | FB-RFS | UFS | Computed |
| #1 | T1:00-2:00 | FB-RBOR | UBOR | Computed |
| #1 | T2:00-2:30 | FB-RICP | UICP | Computed |
| #1 | T2:30-3:30 | FB-RFR | UFR | Computed |
| #1 | T3:30-4:00 | FB-RSBC | USBC | Computed |
| #1 | T4:00-5:00 | FB-RRT | URT | Computed |

In addition, the previously recorded activity sessions for that UserID # Dataset are compared with the most recent session by the platform analytic to adjust the next activity session exercises and provide on-going recommendations to the registered user based on fitness profile and preferences.

E. Dumbbells connected grips Training

Dumbbells Card Reference Datasets

The following is a sample list of distinct Dumbbells exercises and their reference datasets, categorized by "Pectoral Muscles—Bench Press", "Biceps Muscles—Alternated Biceps Curl", "Back Muscles—Kneeling One Arm Row", "Shoulder Muscles—Lateral Raise", "Legs Muscles—Toe Raise". By definition, dumbbells come in variety of weights. As such, the modeling is based on one, or more, types of weights.

The above listing of dumbbells connected grip exercises is not limited to these card reference datasets but can be extended by the reference users, or non-reference users, who can post new reference exercises and their related card reference datasets based on their own experience and fitness level.

The card reference "Bench Press" dataset is identified by its unique code, such as "RBP" for example, and corresponds to the particular sequence of motion that characterizes this particular exercise, as described thereafter:

Raising both dumbbells at the same using a dumbbell bench press. Putting the bench in a 45-degree angle modification helps target the upper region of the pectorals while putting the bench below horizontal helps target the lower levels of the chest muscles.

The PFI is computed for this particular "RBP" exercise, based on one or more types of weights, from the one or several reference users and then used as comparison to the PFIs computed for this same "RBP" by the non-reference users.

The card reference "Alternated Biceps Curl" dataset is identified by its unique code, such as "RABC" for example, and corresponds to the particular sequence of motion that characterizes this particular exercise, as described thereafter:
 Raising both dumbbells at the same by limiting the movement to half-way up The PFI is computed for this particular "RABC" exercise, based on one or more types of weights, from the one or several reference users and then used as comparison to the PFIs computed for this same "RABC" by the non-reference users.

The card reference "Kneeling One Arm Row" dataset is identified by its unique code, such as "RKOAR" for example, and corresponds to the particular sequence of motion that characterizes this particular exercise, as described thereafter:
 Putting the knee and hand on a flat bench targets the middle back muscles (lats) very comfortably and effectively. While the lats does most of the work, the rear deltoid muscle is also solicited in helping raising the dumbbells.

The PFI is computed for this particular "RKOAR" exercise, based on one or more types of weights, from the one or several reference users and then used as comparison to the PFIs computed for this same "RKOAR" by the non-reference users.

The card reference "Lateral Raise" dataset is identified by its unique code, such as "RLR" for example, and corresponds to the particular sequence of motion that characterizes this particular exercise, as described thereafter:
 This exercise is performed while sitting down or with the back supported. Additionally, bending the upper body forward puts a greater emphasis on the rear deltoids, thus making it possible to target specific regions of the shoulders.

The PFI is computed for this particular "RLR" exercise, based on one or more types of weights, from the one or several reference users and then used as comparison to the PFIs computed for this same "RLR" by the non-reference users.

The card reference "Toe Raise" dataset is identified by its unique code, such as "RTR" for example, and corresponds to the particular sequence of motion that characterizes this particular exercise, as described thereafter:
 Target the muscles located in the lower legs, that is calf muscles, or calves. The Toe Raise is the most effective way to strengthen the calves which are solicited during normal daily activities and while engaging in a great variety of sports where running or jumping is involved.

The PFI is computed for this particular "RTR" exercise, based on one or more types of weights, from the one or several reference users and then used as comparison to the PFIs computed for this same "RTR" by the non-reference users.

Dumbbells Extended Reference Datasets

The above basic reference datasets are extended by considering dumbbells weights, gender and fitness level. For instance, male, female, beginner, intermediate, advanced, professional represent natural variations of the reference datasets, as listed, each reference with its own computed PFI, as listed thereafter:

Dumbbell #-Male-Beginner (RBP-RABC-RKOAR-RLR-RTR)
 Dumbbell #-Male-Intermediate (RBP-RABC-RKOAR-RLR-RTR)
 Dumbbell #-Male-Advanced (RBP-RABC-RKOAR-RLR-RTR)
 Dumbbell #-Male-Professional (RBP-RABC-RKOAR-RLR-RTR)
 Dumbbell #-Female-Beginner (RBP-RABC-RKOAR-RLR-RTR)
 Dumbbell #-Female-Intermediate (RBP-RABC-RKOAR-RLR-RTR)
 Dumbbell #-Female-Advanced (RBP-RABC-RKOAR-RLR-RTR)
 Dumbbell #-Female-Professional ((RBP-RABC-RKOAR-RLR-RTR)

Dumbbells Training Playlist

A connected grip dumbbells training is defined by a playlist of dumbbells card reference datasets, based on a particular weight of dumbbells, which are organized in a linear fashion by the human internet of things platform application. This playlist is assembled and presented to the register user who wants to follow the order of the playlist during the time allocated for these exercises.

The playlists are assembled dynamically based on the profile and historical data of the registered user, effectively taken into consideration its gender, age, weight and height for examples coupled with its recorded level of fitness overtime as correlated against existing reference datasets.

Playlists are also customizable by the registered user, or its selected professional trainers, coach or mentors, before the start of a new physical session, providing a mechanism for customizing the computed playlist proposed by the human internet of things platform by for example changing the time of a particular exercise within the playlist or the ordering of the proposed exercises.

The PFI of the overall physical session is then computed from the aggregation of all individual exercise listed from the compiled playlist, and its value compared to the PFIs of both historical and reference datasets, providing direct qualitative and quantitative feedback to the registered user as to its level of performance during the playlist.

Based on the fitness profile of the registered user, rest periods between consecutive exercises can be added preventively to the compiled playlist by the platform application, providing the registered user with time period to recover and adjust prior to the next exercise on that playlist.

Rest periods can also be added dynamically by the platform based on the monitoring of the key sensor data within the datasets captured from the registered user while engaging in the playlist, such as heart rate for example.

Dumbbells Playlist Example

A connected grip registered user is going to provide a high PFI level in a short period of time with this dumbbells playlist example, as listed thereafter:
 Minutes 0:00-1:00: Bench Press—RBP
 Minutes 1:00-2:00: Alternated Biceps Curl—RABC
 Minutes 2:00-3:00: Kneeling One Arm Row—RKOAR
 Minutes 3:00-4:00: Lateral Raise—RLR
 Minutes 4:00-5:00: Toe Raise—RTR Dumbbells Fitness Training Example The above dumbbells playlist example is defined as an activity session with a set of inherited properties, including UserID, Session #, Reference Datasets along with the captured UserDataset # corresponding to the playlist exercises within the activity session.

A Male Beginner "MB" connected grip registered user going through the above dumbbells training generates its own dataset for each of the exercises assembled into the playlist, exercises that are correlated individually and aggregated overall against recorded male beginner referenced datasets.

| Session | Time | Reference Datasets | UserID# Datasets | PFI |
|---------|------|--------------------|--------------------|----------|
| #1 | T0:00-1:00 | MB-RBP | UBP | Computed |
| #1 | T1:00-2:00 | MB-RABC | UABC | Computed |
| #1 | T2:00-3:00 | MB-RKOAR | UKOAR | Computed |
| #1 | T3:00-4:00 | MB-RLR | ULR | Computed |
| #1 | T4:00-5:00 | MB-RTR | UTR | Computed |

In addition, the previously recorded activity sessions for that UserID # Dataset are compared with the most recent session by the platform analytic to adjust the next activity session exercises and provide on-going recommendations to the registered user based on fitness profile and preferences.

F. Barbells Fitness Training

Barbell exercises provide an easy, cheap and effective way of targeting every major muscle groups in the human body. By definition, barbells come in variety of types as separate weights can be attached on either side of the connected grips. As such, the modeling is based on one, or more, types of weights.

Barbells Card Reference Datasets

The following is a list of separate Barbells exercises and their reference datasets.

The following is a sample list of distinct Barbells exercises and their reference datasets, categorized by "Abdominal—Trunk Rotation", "Chest—Bench Press Incline", "Shoulders—Military Press", "Biceps—Biceps Curl Standing", "Triceps—Triceps Extension Seated, "Back—Deadlift", "Legs—Squat" and "Forearms—Wrist Curl". By definition, barbells can be paired with a variety of weights. As such, the modeling is based on one, or more, types of weights.

The above listing of barbells connected grip exercises is not limited to these card reference datasets but can be extended by the reference users, or non-reference users, who can post new reference exercises and their related card reference datasets based on their own experience and fitness level.

The card reference "Trunk Rotation" dataset is identified by its unique code, such as "RTR" for example, and corresponds to the particular sequence of motion that characterizes this particular exercise, as described thereafter:
Sit on a bench and place a barbell behind the neck, holding it with both hands in a wide grip position. Rotate the upper body from one side to the other with short pauses between rotations while trying to keep the back straight throughout.

The PFI is computed for this particular "RTR" exercise, based on one or more types of weights, from the one or several reference users and then used as comparison to the PFIs computed for this same "RTR" by the non-reference users.

The card reference "Bench Press Incline Wide Grip" dataset is identified by its unique code, such as "RBPIWG" for example, and corresponds to the particular sequence of motion that characterizes this particular exercise, as described thereafter:
Lie down on the back on the incline bench and grasp the barbell with both hands in a wide-grip position. Push the barbell straight up until the elbows are close to being locked and lower it back slowly after a short pause. Breathe out while pushing the bar and breathe in while lowering it back.

The PFI is computed for this particular "RBPIWG" exercise, based on one or more types of weights, from the one or several reference users and then used as comparison to the PFIs computed for this same "RBPWIG" by the non-reference users.

The card reference "Military Press Seated" dataset is identified by its unique code, such as "RMPS" for example, and corresponds to the particular sequence of motion that characterizes this particular exercise, as described thereafter:
Sit on one end of the bench and hold the barbell in front of the neck, just above the shoulders. Push the barbell straight up until the elbows come close to locking and lower it back down slowly after a short pause.

The PFI is computed for this particular "RMPS" exercise, based on one or more types of weights, from the one or several reference users and then used as comparison to the PFIs computed for this same "RMPS" by the non-reference users.

The card reference "Biceps Curl Standing" dataset is identified by its unique code, such as "RBCS" for example, and corresponds to the particular sequence of motion that characterizes this particular exercise, as described thereafter:
Stand up and hold the barbell with the hands, palms facing forward in a medium-grip position. Raise the barbell up towards the shoulders and slowly lower it back down after a short pause.

The PFI is computed for this particular "RBCS" exercise, based on one or more types of weights, from the one or several reference users and then used as comparison to the PFIs computed for this same "RBCS" by the non-reference users.

The card reference "Triceps Extension Seated" dataset is identified by its unique code, such as "RTES" for example, and corresponds to the particular sequence of motion that characterizes this particular exercise, as described thereafter:
Sit on one end of the bench and hold a barbell behind the head, upper arms pointing up, elbows at 90-degree angles. Raise the barbell by straightening the arms and slowly lower it back after a short pause. Keep the upper arms still throughout.

The PFI is computed for this particular "RTES" exercise, based on one or more types of weights, from the one or several reference users and then used as comparison to the PFIs computed for this same "RTES" by the non-reference users.

The card reference "Deadlift" dataset is identified by its unique code, such as "RDE" for example, and corresponds to the particular sequence of motion that characterizes this particular exercise, as described thereafter:
Crouch down to reach the barbell on the floor and grab it with both hands in a medium-grip position, arms extended, legs at shoulder width. Raise body up while keeping the arms extended and slowly lower back down after a short pause. Breathe out while raising body and breathe in while lowering body back.

The PFI is computed for this particular "RDE" exercise, based on one or more types of weights, from the one or several reference users and then used as comparison to the PFIs computed for this same "RDE" by the non-reference users.

The card reference "Squat" dataset is identified by its unique code, such as "RSQ" for example, and corresponds to the particular sequence of motion that characterizes this particular exercise, as described thereafter:

Place a barbell on top of the shoulders behind the neck and crouch down until the thighs are parallel to the ground. Push up with the legs and buttocks to stand up and slowly bring body back down after a short pause. Keep back straight throughout.

The PFI is computed for this particular "RSQ" exercise, based on one or more types of weights, from the one or several reference users and then used as comparison to the PFIs computed for this same "RSQ" by the non-reference users.

The card reference "Wrist Curl Standing" dataset is identified by its unique code, such as "RWCS" for example, and corresponds to the particular sequence of motion that characterizes this particular exercise, as described thereafter:

Stand up and hold the barbell behind body, arms extended, palms facing back. Raise the barbell up by curling wrists and slowly lower it back down after a short pause. Keep arms still throughout.

The PFI is computed for this particular "RWCS" exercise, based on one or more types of weights, from the one or several reference users and then used as comparison to the PFIs computed for this same "RWCS" by the non-reference users.

Barbells Extended Reference Datasets

The above basic reference datasets are extended by considering barbells weights, gender and fitness level. For instance, male, female, beginner, intermediate, advanced, professional represent natural variations of the reference datasets, as listed, each reference with its own computed PFI, as listed thereafter:

Barbells #-Male-Beginner (RTR-RBPIWG-RMPS-RBCS-RTES-RDE-RSQ-RWCS)
Barbells #-Male-Intermediate (RTR-RBPIWG-RMPS-RBCS-RTES-RDE-RSQ-RWCS)
Barbells #-Male-Advanced (RTR-RBPIWG-RMPS-RBCS-RTES-RDE-RSQ-RWCS)
Barbells #-Male-Professional (RTR-RBPIWG-RMPS-RBCS-RTES-RDE-RSQ-RWCS)
Barbells #-Female-Beginner (RTR-RBPIWG-RMPS-RBCS-RTES-RDE-RSQ-RWCS)
Barbells #-Female-Intermediate (RTR-RBPIWG-RMPS-RBCS-RTES-RDE-RSQ-RWCS)
Barbells #-Female-Advanced (RTR-RBPIWG-RMPS-RBCS-RTES-RDE-RSQ-RWCS)
Barbells #-Female-Professional (RTR-RBPIWG-RMPS-RBCS-RTES-RDE-RSQ-RWCS)

Barbells Training Playlist

A connected grip barbells training is defined by a playlist of barbells card reference datasets, based on a particular combination of barbell and set of weights, which are organized in a linear fashion by the human internet of things platform application. This playlist is assembled and presented to the register user who wants to follow the order of the playlist during the time allocated for these exercises.

The playlists are assembled dynamically based on the profile and historical data of the registered user, effectively taken into consideration its gender, age, weight and height for examples coupled with its recorded level of fitness overtime as correlated against existing reference datasets.

Playlists are also customizable by the registered user, or its selected professional trainers, coach or mentors, before the start of a new physical session, providing a mechanism for customizing the computed playlist proposed by the human internet of things platform by for example changing the time of a particular exercise within the playlist or the ordering of the proposed exercises.

The PFI of the overall physical session is then computed from the aggregation of all individual exercise listed from the compiled playlist, and its value compared to the PFIs of both historical and reference datasets, providing direct qualitative and quantitative feedback to the registered user as to its level of performance during the playlist.

Based on the fitness profile of the registered user, rest periods between consecutive exercises can be added preventively to the compiled playlist by the platform application, providing the registered user with time period to recover and adjust prior to the next exercise on that playlist.

Rest periods can also be added dynamically by the platform based on the monitoring of the key sensor data within the datasets captured from the registered user while engaging in the playlist, such as heart rate for example.

Barbells Playlist Example

A connected grip registered user is going to provide a high PFI level in a short period of time with this barbells playlist example, as listed thereafter:

Minutes 0:00-2:00: Trunk Rotation—RTR
Minutes 2:00-4:00: Military Press Seated—RMPS
Minutes 4:00-6:00: Biceps Curl Standing—RBCS
Minutes 6:00-8:00: Deadlift—RDE
Minutes 8:00-10:00: Squat—RSQ Barbells Fitness Training Example The above barbells playlist example is defined as an activity session with a set of inherited properties, including UserID, Session #, Reference Datasets along with the captured UserDataset # corresponding to the playlist exercises within the activity session.

A Female Advanced "FA" connected grip registered user going through the above barbells training generates its own dataset for each of the exercises assembled into the playlist, exercises that are correlated individually and aggregated overall against recorded male beginner referenced datasets.

| Session | Time | Reference Datasets | UserID# Datasets | PFI |
|---|---|---|---|---|
| #1 | T0:00-2:00 | FA-RTR | URTR | Computed |
| #1 | T2:00-4:00 | FA-RMPS | UMPS | Computed |
| #1 | T4:00-6:00 | FA-RBCS | UBCS | Computed |
| #1 | T6:00-8:00 | FA-RDE | UDE | Computed |
| #1 | T8:00-10:00 | FA-RSQ | USQ | Computed |

In addition, the previously recorded activity sessions for that UserID # Dataset are compared with the most recent session by the platform analytic to adjust the next activity session exercises and provide on-going recommendations to the registered user based on fitness profile and preferences.

G. Gamification Examples of Connected Grips Activity-Card Modeling and Visualization The following are examples of gamification of connected grip activities "Blackjack"

Similar to a game of blackjack when the $1^{st}$ player to reach 21 wins the round, the idea here is to set a particular performance level, as computed by its PFI, to one, or several activities. The $1^{st}$ registered user to reach the preset PFI, i.e. power output value, wins the round.

"Solitaire"

Similar to a game of solitaire, a registered user has access to a deck of exercise-specific cards, within a particular activity, such as "Elastic Bands" or across several types of activities, such as "Jump Rope and Barbells" for example.

Based on the 1st activity-card selected, the platform computes a custom playlist of exercise-specific cards across all the cards available in the related activity decks.

"My Deck"

From the available activity-based deck of cards, a registered user picks a subset of cards to create its own custom deck, or playlist. That deck represents the specific exercises, and the order in which this registered user is most interested in performing them. The deck can be posted and shared with other registered users within the platform marketplace.

"Team"

In this mode, two, or more registered users, have the same set of cards organized into the same playlist of exercises. The idea is to get them to perform the same playlist, at the same time, or delayed, where their respective PFI and other captured data is compared and ranked in real-time.

"My Cards"

In this mode, a registered user, such as a trainer or professional, is recording a new card-based exercise and is adding it to "My Deck" or alternatively is publishing it on the platform activity cards marketplace at which point the new card gets available to any registered users. The new card can be edited from an existing one, giving proper rights, or created from the recording of a new activity. In addition, new cards can integrate specific branding or merchandising information that refers to the owner of the card.

"Surprise Me"

In this mode, a number of card-based exercises is preselected by the platform, based on the registered user profile and historical data, and compiled into a surprise playlist for the registered user.

H. Multi-Dimensional Information Modeling (MDIM)

Connected grip-based platforms compute multi-dimensional information modeling (MDIM) for registered users of the platform. A MDIM quantifies a registered user's engagement, performance and achievements from the aggregation of multiple datasets categorized by dimension classification, such as "Motion, "Physiology", "Environment", "Social" and "Diet" among others.

Figure 5:
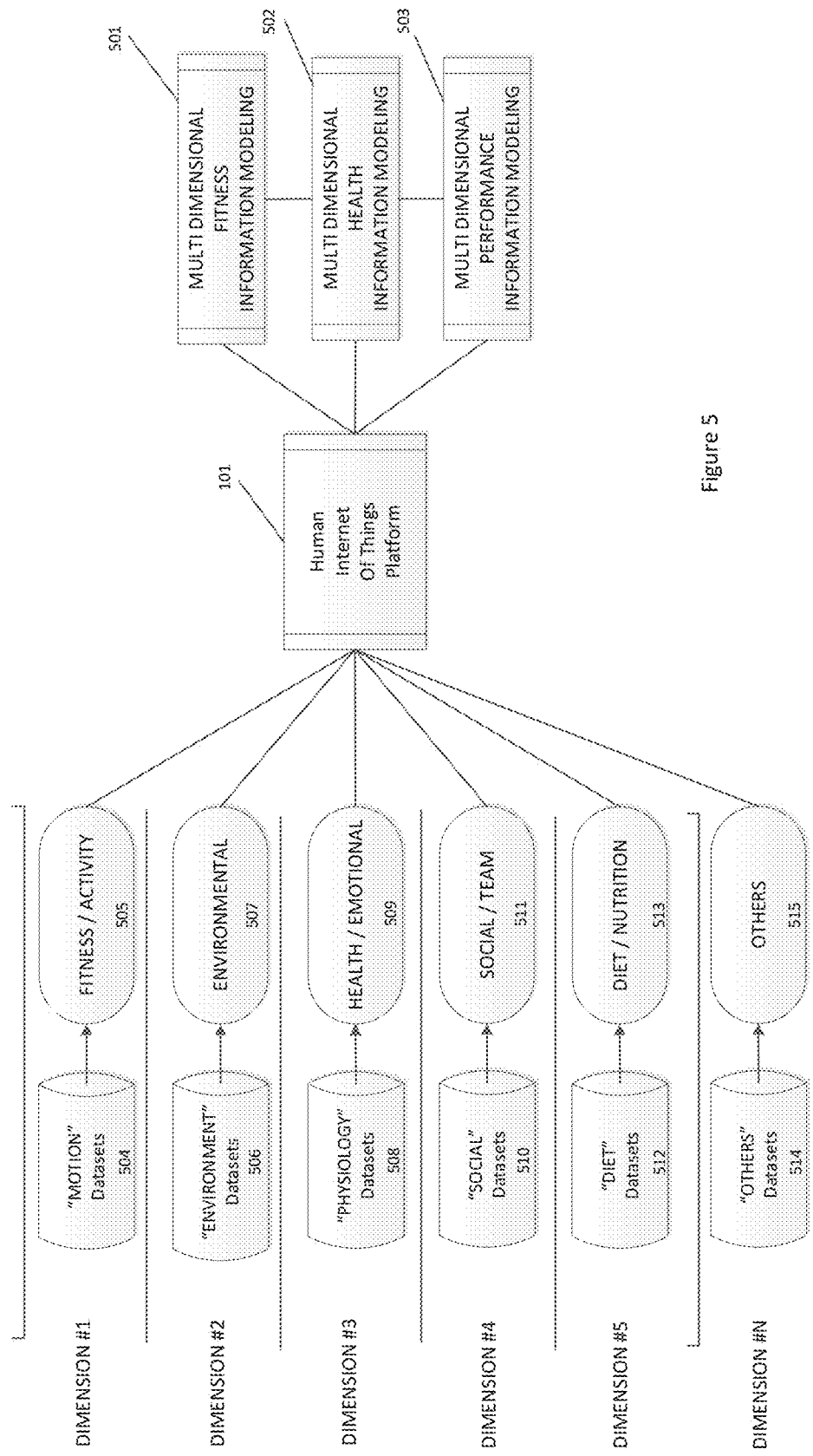
FIG. 5 illustrates a multi-dimensional information modeling (MDIM) applied to analytic fitness, health and performance in human internet of things platforms.

FIG. 5 illustrates a multi-dimensional information modeling (MDIM) applied to connected grips analytic fitness, health and performance platforms.

As illustrated in FIG. 5, connected grip platforms 101 rely on the onboarding and processing of multiple datasets, both internal and external, to build multi-dimension analytic modeling of registered users' activities, including multi-dimensional fitness 501, multi-dimensional health 502 and multi-dimensional performance 503, for example.

For instance, the fitness activity dimension 501 is computed from the "Motion" dataset classification 504 originating from the connected grips embedded sensors such as its accelerometer, gyroscope and compass for example, as well as other external available $3^{rd}$ party datasets from other connected wearables available APIs. This particular dimension provides contextual information to the processing of the other dimensions by matching contextual activities to the captured dataset, as enabled by the registered user when interacting with connected grip-based products and others non connected grip-based ones, providing an overall view of all fitness related activities 505 performed by the user with contextual information at its core.

As another dimension, the environmental dimension 502 is computed from the "Environment" classification dataset 506 originating from the connected grips embedded sensors such as its ambient temperature, barometric pressure, and humidity level as well as other external available $3^{rd}$ party dataset, such as day and time, GPS location, weather conditions or forecast for example.

As another dimension, the health and emotional dimension 509 is computed from the "Physiology" classification dataset 508 originating from the connected grips skin-contact sensors, such as heart rate, pulse oximeter, galvanic skin response, body temperature, hand strength grip and ECG, as well as other external available $3^{rd}$ party dataset integrating for example temporary wireless skin sensors, wireless weighting scale, body fat index or other health related historical data.

As another dimension, the social and team dimension 511 is computed from the "Social" classification dataset 510 originating from the connected grips social activities, as initiated when interacting with other connected grip-based users, either as individual or as a team, as well as other $3^{rd}$ party available datasets such as personal or professional social network connections.

As another dimension, the diet and nutrition dimension 513 is computed from the "Nutrition" classification datasets 512 provided by the registered users of connected grip-based platforms and from available $3^{rd}$ party dataset. This dataset is particularly important when correlating the recorded level of activities or performance of registered users with the amount, type and nutritional value of the food processed before, during and after active connected grip-based sessions.

Other dimensions 515 can be added to the connected grip platforms to enhance and complete the information modeling processing.

To generate a MDIM for fitness, health or performance, the connected grip platform 101 filters the various datasets into a plurality of dimensions and categories of user activity data. Each dimension's category is associated with a scoring metric defining a mapping between activities completed by a user and a score assigned to the dimension's activity category. Based on the user activity data of a registered user filtered into each dimension's category and the scoring metric associated with the dimension's category, the platform scores the user's MDIM activities. The connected grip platform generates a MDIM for each user of the platform based on their scored activity dimensional data.

Accordingly, a MDIM provides a quantitative representation of a user's activities, environmental, physiology, social, diet and performance, representation of its level of engagement, achievements and experiences. Based on their respective MDIM, registered users of the connected grip-based platform can be quantitatively evaluated and compared. For example, users entering competitive sporting events can compare their relative MDIMs to compare their overall qualifications or eligibility. Moreover, a user's MDIM may be recalculated based on a number of different factors, such as environmental data for example. Each user therefore has multiple MDIMs that depend on the contextual information in which the MDIM was calculated.

The registered user activity logs store user data aggregated according to internal and $3^{rd}$ party partner datasets. A multi-dimension fitness, health or performance training program typically has a series of assigned or recommended activity-based exercises for registered users to complete within a specified time period. During the time period associated with a particular program, registered users interact with the connected grip-based platform to complete the assigned or recommended activity-based exercises, and the platform stores activities of the registered users in their respective activity logs.

The MDIM categories database stores, for each of a plurality of dimension categories of user activity data, a scoring metric and a relative weight for the category. A scoring metric defines a mapping between activity-based exercises completed by a registered user and a score assigned to the activity dimension category. A weight defines a relative importance of the dimension's categories for a user's overall MDIM. The weights for the categories of registered user activity-based exercises data may be pre-defined, or may be adjusted to accommodate desired registered user profile or preferences.

For example, a personal trainer may specify weights for the categories when comparing registered users, specifying a relative importance of the categories for comparing the registered user's performance in multi-dimension fitness programs. As another example, a professional football coach may specify weights for the dimension categories when comparing professional football athletes, specifying a relative importance for the dimension categories for comparing the athlete's engagement and overall performance.

The scoring module of the connected grip-based platform retrieves user activity-based exercises data from the user profile database and user activity logs, and filters the user activity data into the dimensions, categories and subcategories defined in the MDIM dimensions categories database. Based on the scoring metrics for the subcategories, the scoring module scores the user activity data.

For example, some subcategories may be scored based on the number of activity-based exercises a registered user has completed within a category, such as a number of recorded fitness sessions the user has taken, the number of activity-based exercises performed by the user, or the number of competitive events the user has competed into. Other subcategories may be scored relative to a baseline. A baseline may be a fixed value specified by, for example, an instructor of a fitness course, a physical therapy trainer, a professional coach, a medical professional, a professional nutritionist, or a baseline may be an average number of comparable activity-based exercises completed by registered users of the platform. For example, the number of pushups by a user may be scored based on whether a user has more than or less than a number of pushups assigned by a trainer. Alternatively, the number of pushups by a user may be scored based on whether the user has more or fewer pushups than an average number of pushups made by other similar users in the multi-dimensions fitness program.

The score assigned to a dimensional activity completed by a user may depends on the amount of time elapsed since the user completed the activity-based exercises. The scoring module may apply a time decay factor to the scored user activity data, decaying the score based the amount of time since the user completed the activity.

The MDIM generation module generates a MDIM for users of the connected grip-based platform based on the scores calculated by the scoring module. In one embodiment, the MDIM generation module generates a MDIM by a weighted sum of the scored user dimension activity data. For example, given fitness activity category scores $A_i$, environment category scores $E_j$, physiology category scores $P_k$, social category scores $S_k$ and diet category scores $D_l$, each with a respective weight W, the MDIM generation module generates a MDIM multi-dimension fitness by the equation:

$$MDIM=\Sigma(A_i \times W_{Ai})+\Sigma(E_j \times W_{Ej})+\Sigma(P_k \times W_{Pk})+\Sigma(S_l \times W_{Sl})+\Sigma(D_l \times W_{Dl})$$

Alternatively, the MDIM generation module may weight the categories of data differently. For example, the MDIM generation module may generate a MDIM by the equation:

$$MDIM=\Sigma(A_i \times W_{Ai})+\Sigma(E_j \times W_{Ej})+\Sigma 2(P_k \times W_{Pk})+\Sigma 3(S_l \times W_{Sl})+\Sigma(D_l \times W_{Dl})$$

In the above equation, the health and social weighted listed datasets are ranked differently than the activities and diet ones.

The comparison module applies a set of filters to the MDIM generated by the MDIM generation module to provide a mechanism for comparing users of the connected grip-based platform. The comparison module filters the MDIMs based on characteristics of the associated users to identify a group of users sharing one or more common characteristics. The corresponding MDIMs of the users in the filtered group are then ranked to provide a relative ranking of the users in the group for comparing the users. The comparison module filters MDIMs based on user profile information of the users.

Various examples of user profile filters include sport domains, type of activities and exercises, gym locations, number and type of achievements, competitions, health level, location and personal profile of a user. For example, filtering the MDIM dataset by sport practiced provides a relative ranking of users within a selected sport or profession. Filtering the MDIM dataset by gym location provides a relative ranking of users who attend the same gym or between users who attend gyms offering similar types of fitness activities and programs. Filtering the MDIM dataset by competition provides a relative ranking of users who are competing against other users either in professional or amateur clubs. Finally, adding MDIM of selected recognized professional athletes and trainers provide referenced baseline MDIMs that users of the connected-grip based platform can compare with, perform against and use as motivational and inspirational tool.

I. Connected Grips—"Dual-Handle" Systems

Connected grips dual-handle systems are defined as a single handle equipped with two connected grips, one for the left hand and one for the right hand.

For example, an indoor rowing system typically includes a single handle that a rowing user engages with when performing rowing activity-based exercises.

As another example, an indoor or road bicycle typically includes a single handlebar that a biking user engages with when performing biking activity-based exercises.

As yet another example, a golf club typically includes a handle that a golf user engages with when performing golf activity-based exercises.

Dual-Handle Integrated Connected Grips Rowing Systems

Figure 6:
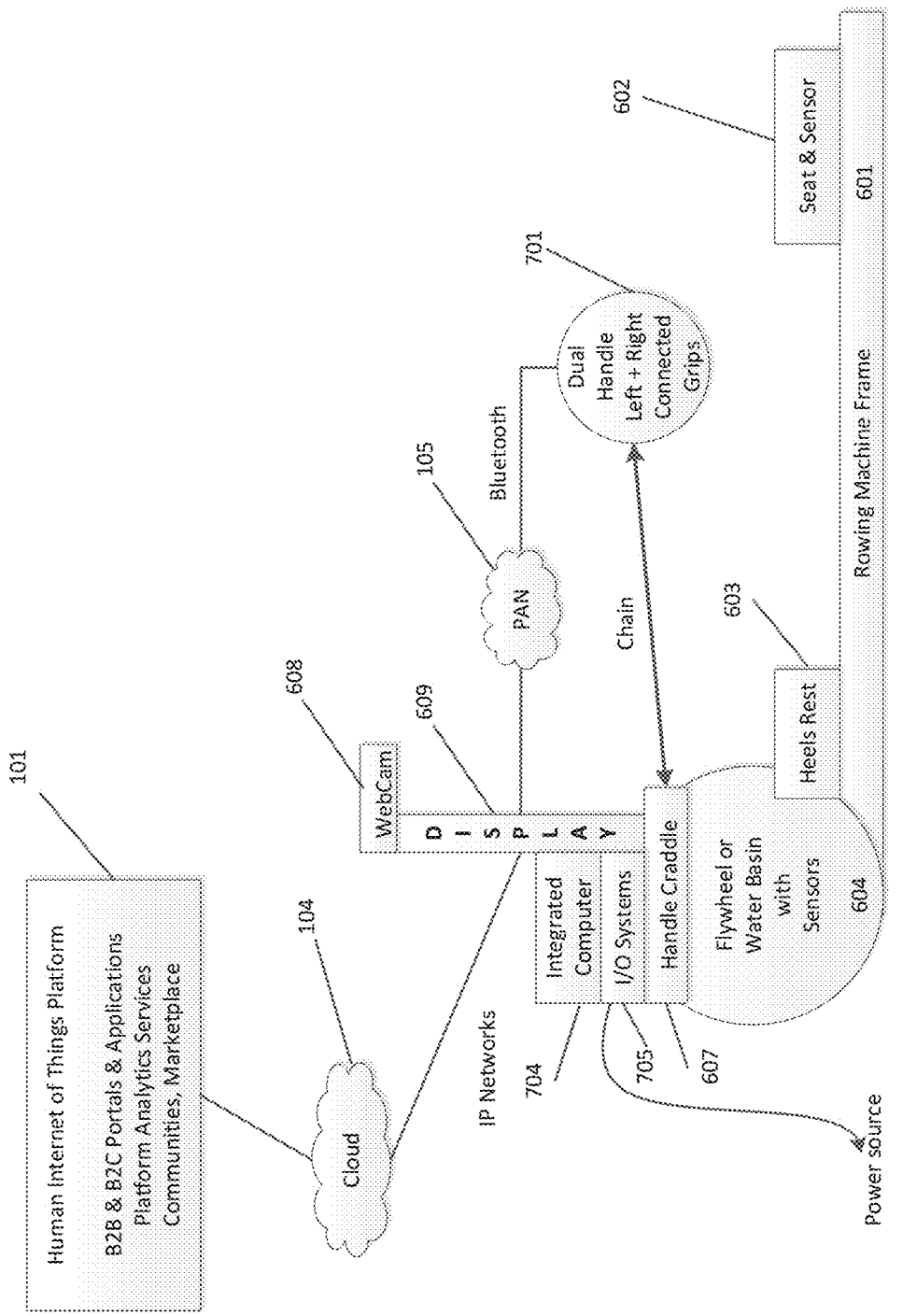
FIG. 6 illustrates a rowing machine equipped with a dual handle connected grips and multimedia on-board computer connected to the internet of things platform.

FIG. 6 illustrates a rowing machine equipped with a dual handle connected grips and integrated on-board computer connected to the internet of things platform.

As illustrated in FIG. 6, a dual-handle integrated connected grip rowing system is made of the following key components:

Dual-handle connected grips 701
Dual-handle cradle 607
On-board computer and display 704, 609
Rowing body frame and mechanical parts 601, 602, 603, 604, 607
Network connection 104 to the human internet of things platform 101

Dual-Handle Connected Grips

Figure 7:
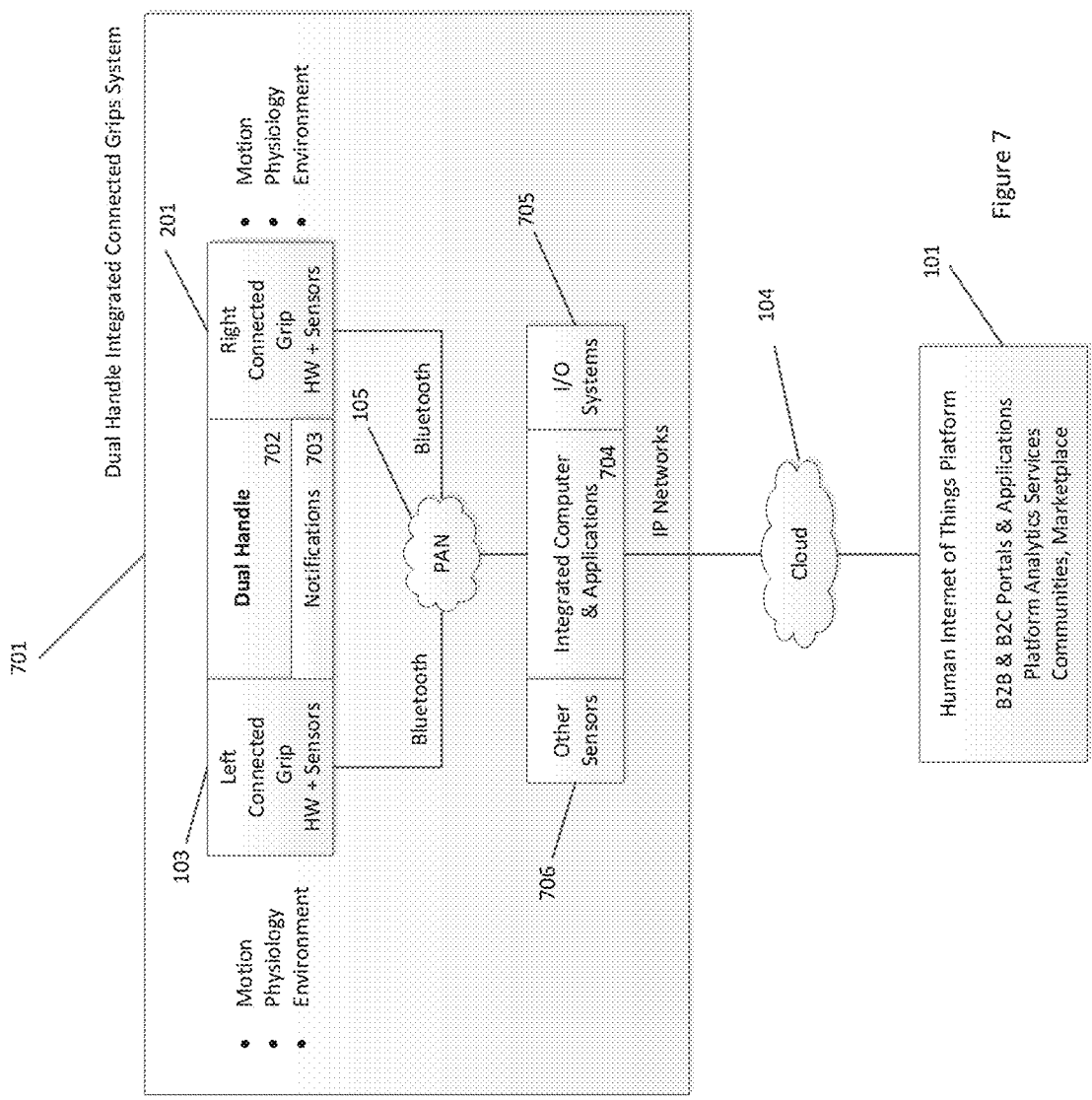
FIG. 7 illustrates a system component view of a dual handle integrated connected grips system interfaced to an internet of things platform.

FIG. 7 illustrates a system component view of a dual handle integrated connected grips system 701 interfaced to an internet of things platform 101.

As illustrated in FIG. 7, the dual-handle 701 is made of a set of connected grips, one for the left hand 103 and another for the right hand 201 which are integrated into a single handle that is attached to a chain for making a physical connection to the rowing system.

Each connected grip includes an array of sensors, controlled by an embedded controller and local firmware. Each sensor's datasets are streamed in real-time over a personal area network 105, such as Bluetooth, and captured by the on-board integrated computer.

Connected grip embedded sensors are classified by their functions and typically include motion, physiology and environmental layers for examples. These 3 layers collectively define the dataset captured from each connected grip embedded sensors.

Notifications 703 are provided directly on the dual-handle through its embedded LEDs and vibration sensors that provide visual and sensory feedback to the user of the rowing system.

Dual-Handle Cradle

The cradle 607 is hosting the dual-handle 701 when it is not used by a user. The primary function of this handle is to recharge the batteries of each embedded connected grips, by using a charging connector, such as micro-USB, for example.

When resting on its cradle, the dual-handle built-in LEDs notify 703 users that it is being recharged and provides an indication of its current battery level.

In addition, other types of notifications may be delivered to the dual-handle 701 by the onboard computer system 704 based on platform events management, such as an upcoming fitness class, private coach lesson, invitation to join a team or an invitation to compete, for examples.

On-Board Computer and Display

The on-board computer 704 is an integrated computer system and display unit 609 that runs on a standard operating system such as Android for example and which is bundled with custom software connected grips application.

The stand-alone application controls the user interface, interactive elements and services that the human internet of things platform 101 is presenting to its registered users as well as access to the human interface of things platform back-end systems.

The built-in Bluetooth network interface 105 is pairing the on-board computer 704 to the dual-handle connected grips 701, effectively receiving and capturing the streamed datasets from each connected grip.

The display unit 609 typically includes a built-in touch screen interface for controlling the stand-alone application user interface, a built-in video camera 608 and its microphone as well as a set of left and right speakers for playing audio files or special effects.

Other Input/Outputs systems 705 may include support for a variety of network connection, such as WiFi and Ethernet for examples, as well as optional support for external storage, NFC, Fingerprint scanner or QR Code reader, for examples, based on system configuration.

Rowing Body frame

Most rowing body frames 601 consist of an energy damper or braking mechanism connected to a chain and a dual-handle. The foot stretcher 603, where rowers put their feet, is attached to the same frame as the energy damper. Rowing frames typically include a rail which either the seat 602 or the braking mechanism slide upon.

There are three possible designs to allow the foot stretcher with flywheel, or water basin, and handle to move relatively nearer and apart from each other.

The first option is the most common, with the foot stretcher and flywheel, or water basin, both fixed, with only the seat sliding on a rail. This is generally analogous to the seat sliding on rails in the boat.

The second option is where both the seat and the foot stretcher slide on a rail. This is analogous to both the seat sliding on the boat, and the boat sliding relative to the rower, on the water. The relative movement of seat and flywheel, or water basin, is similar to the result of the rower moving at steadier average speed while the boat's speed varies much more relative to the rower.

The third option has the seat fixed. Only the foot stretcher slides backward and away from the rower.

Braked resistance systems include magnetic, air and water resistance rowers. These systems are mechanically similar as they use a dual-handle connected to a flywheel or water basin 604, by rope, chain, or strap to provide resistance to the user, differing only in braking mechanism implementation. Because the handle 701 is attached to the resistance source by rope or similarly flexible media, the trajectory of the hands in the vertical plane is free making it possible for the rower to emulate the hand height difference between the stroke and the return. Most of these systems have the characteristic sliding seat typical of competitive on-the-water boats.

The on-board computer 704 calculates the user's power by measuring the speed of the flywheel or water basin 604 during the stroke and then recording the rate at which it decelerates during the recovery. Using this and the known moment of inertia of the flywheel or water basin, the computer is able to calculate speed, power, distance and energy usage.

Regardless of types, existing rowing body frames can be retrofitted by replacing their original dual-handle with a connected grips dual-handle 701 and switching their existing on-board computer (assuming one is installed) with a connected grip compatible on-board multimedia computer, bring the full range of the human internet of things services and applications to existing and older rowing systems.

In addition to the standard speed sensor that measures the speed of the flywheel or water basin, connected grips rowing systems may also add a motion and accelerometer sensor directly into the seat 602 of the rowing frame, in order to effectively modeling both the upper and lower body motion while engaging in rowing activities.

The seat motion sensor 602, when included, as well as the flywheel or water basin sensors, are interfaced to the connected grip on-board computer and added to the datasets captured from the user's rowing activities.

Network Connection

An active network connection 104 is required to interface the connected grips system 701, such as integrated rowing system for example, to the human internet of things platform 101 and its services for receiving incoming video streams for live fitness or sport events, access platform consumer portal and account management systems, receive suggestions and recommendations from live coach or artificial intelligence or compete with other users or synchronize activities between multiple connected grips systems for examples.

Events Management in Connected Grips Based Systems

Integrated connected grips systems, such as rowing, biking or weight lifting are being engaged by users in a variety of use cases, from individual fitness exercises, coach-driving sessions, competitive events or team-based competitive events for examples.

Figure 8:
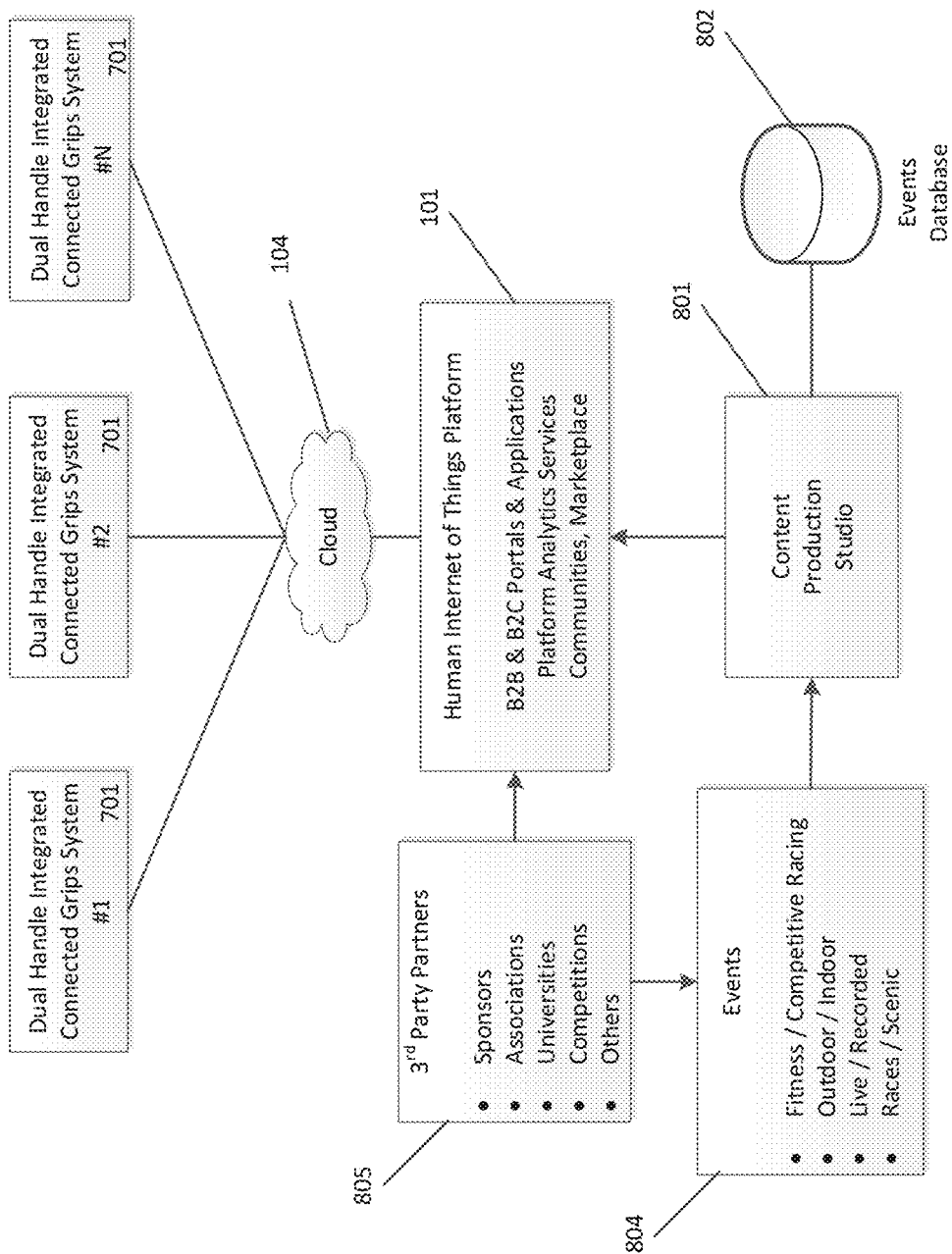
FIG. 8 illustrates multiple dual handle integrated connected grips systems interfaced to an internet of things platform with content production studio and events management.

FIG. 8 illustrates multiple dual handle integrated connected grips systems 701 interfaced to an internet of things platform 101 with content production studio 801 and events management 804.

The following is a sample list of events that the human internet of things platform is managing and scheduling for its registered users:

Live Class Event

A live class is scheduled at a particular day and time, and streamed by the platform services. A live class is performed live by at least one coach or instructor. Students who registered to a live class are joining that class from their individual connected grips systems, watching the live video from the coach or instructor from their on-board computer running the connected grips application. In this model, the instructor can have any number of students joining its class. A listing and ranking of the students registered in the class is provided to all attendees based on their captured datasets with options to make new connections or join groups.

Recorded Class Event

A recorded class is a live class which has been recorded for later consumption. A recorded class is typically part of a library of recorded classes that registered users can access on-demand at any time.

Coaching Event

A live, or delayed, coaching session is typically organized between a coach and at least one student. Using the built-in webcam and microphone of the connected grips systems, a video and audio of both coach and student is managed by the human internet of things platform, providing for video and audio-based feedback and recommendations based on video and the captured student's connected grips datasets.

Competition Event

A competition event is typically a gathering of multiple registered users of similar connected grips systems, such as rowing or jump rope, who join to compete among themselves on a particular activity at a particular day/time. For example, a large number of indoor rowing competitions are held all over the world, including the indoor rowing world championships events. Most competitions are organized into categories based on sex, age, and weight class.

Outdoor competitions, such as live regattas or bicycle races, for examples, are inherently limited by the number of attendees that can actually register to these local events. As an alternative, the human interface of things platform is organizing online competitive events that run in parallel, or in addition, to existing competitions, as they get delivered.

For instance, a regatta event organized at a particular location and timetable may partner with the human internet of things platform to run an on-line competition of the same event, synchronously or not, therefore providing for a larger number of attendees to join and compete during that regatta.

Similarly, competition events organized between multiple teams, such as a bicycle peloton or regatta boats, inherently require the synchronization of multiple users within a team while it compete against other teams. For example, at the current Olympics, there are 14 different rowing events, only 2 of which are for single sculls, the rest being for double sculls, quadruple sculls, coxless pair, coxless four or eight, offered to men or women.

Such competitive events may be organized online by the human internet of things platform which plan, manage and run these events between its registered users, in an on-line community of competitive users.

Dynamic Video Playback in Connected Grips Based Systems

Video typically provides for engaging and motivational user experiences. A video of a user recorded with connected grips systems allows the human internet of things platform to correlate a particular video to specific user datasets, matching the recorded video effort to the overall physical effort being produced over the length of the recording.

For instance, a coach or instructor who is being recorded during a particular fitness or competitive event is providing 2 sets of referential for users who will watch that video later on, one with the content of the video(s) and the other with the captured datasets resulting from its engagement overtime with a connected grips system.

For example, a rowing coach who is being recorded rowing on a particular outdoor water-based scenic location, provides support for the video recording from that location and from whatever viewpoint, correlated with the actual datasets captured from the rowing exercises that this rower performed while using the connected grip rowing systems, including motion, physiology and environment data layers.

As another example, a cycling coach, who is being recorded cycling on a particular outdoor road-based scenic location, provides support for the video recording from that location, from whatever viewpoint, correlated with the actual datasets captured from the biking exercises that this rider performed while using the connected grips biking systems, including motion, physiology and environment data layers.

When capturing reference video, the recorded cameras can be placed at one, or more, locations on the connected grip systems, as well as outside of the systems by using for example one, or more, remote controlled flying drones to provide alternate viewpoints, effectively resulting in multiple video streams from multiple angles and viewpoints, all synchronized from the captured datasets of the user being recorded.

Because the recorded reference video is expressed as a certain number of video frames per second, the correlation effectively matches the user's captured speed, motion, physiology and environment data layers to the recorded video frame rate.

As a result, when a particular reference recorded video is being playback to a registered user of a connected grip system, the human internet of things platform correlates the real-time speed, motion, physiology and environment data sets captured from that user to the recorded reference datasets, effectively providing for a method to adjust dynamically the video playback frame rate based on the differential between the actual real-time datasets and the recorded one.

Figure 9:
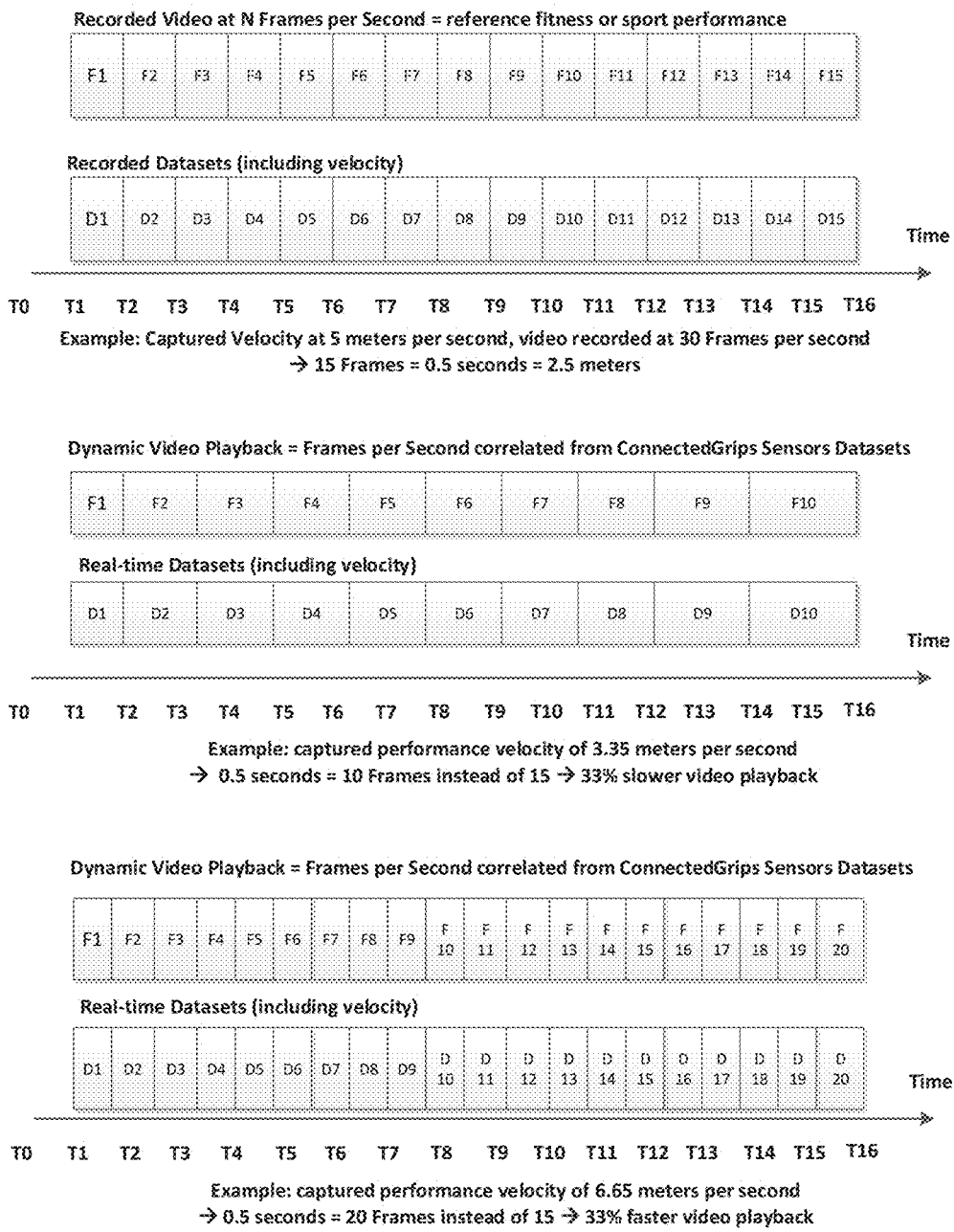
FIG. 9 illustrates dynamic video playback scenarios based on the correlation of user's connected grip datasets

FIG. 9 illustrates dynamic video playback scenarios based on the correlation of user's connected grip datasets.

Figure 10:
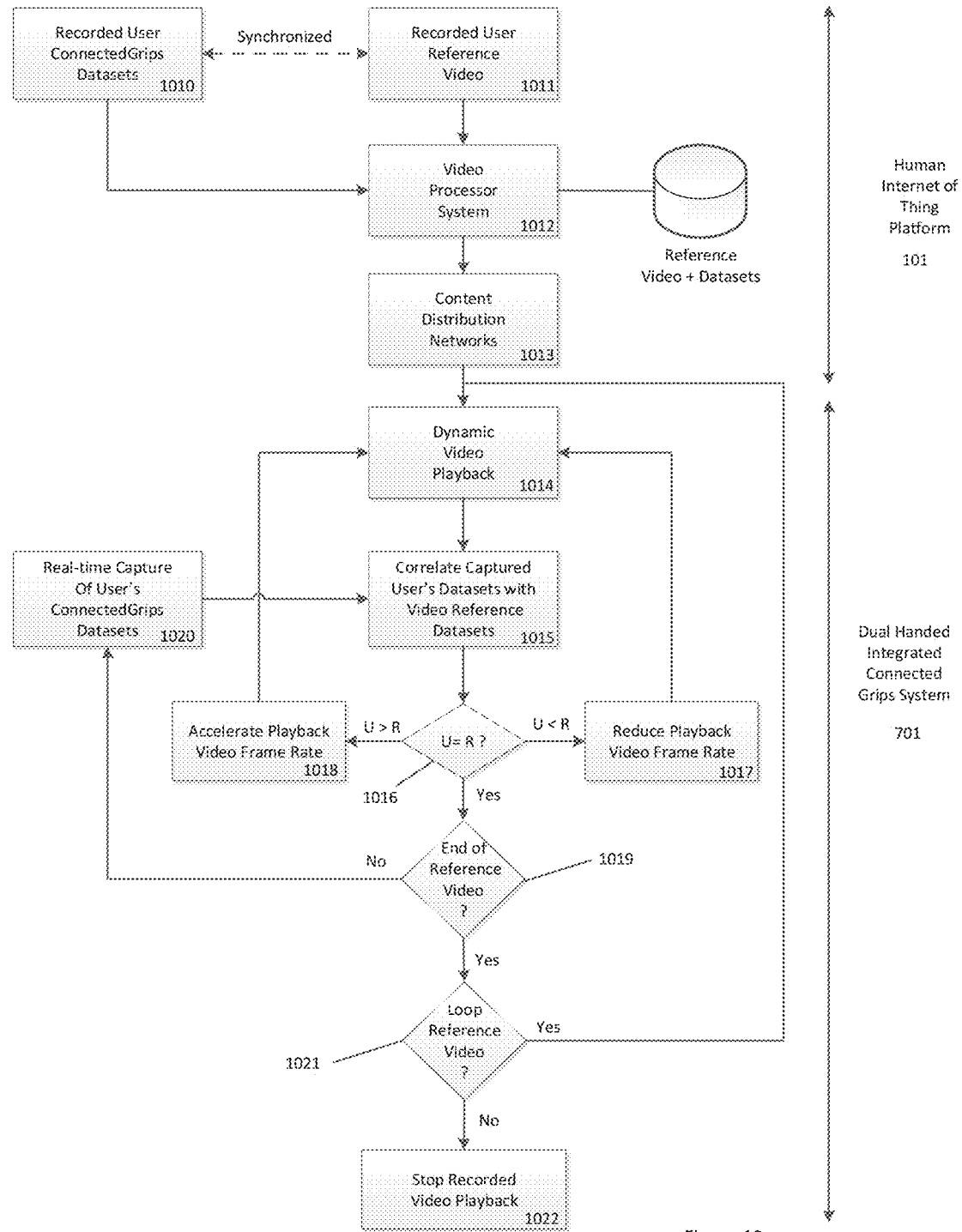
FIG. 10 illustrates a method for dynamic playback of a recorded reference video based on the real-time correlation of the user's connected grip datasets.

FIG. 10 illustrates a flowchart for dynamic playback of a recorded reference video based on the real-time correlation of the user's connected grip datasets.

As illustrated in FIGS. 9 and 10, a reference fitness or competitive performance video has been recorded at for example a velocity of 5 meters per second at 30 frames per second. As a result, 15 seconds of video are representing a 0.5 second time interval during which the forward motion is 2.5 meters. The effort produced during that time is characterized by the datasets captured from the user performing it and can be expressed for example as speed over time.

When a different user is presented with the same recorded video of that reference user's performance, the video playback frame rate of the recorded video gets adjusted based on the real-time differential between these 2 users, effectively providing a method for slowing, accelerating, or keeping the playback of the video frame rate of the referenced video.

As illustrated in FIG. 9, a user who is performing slower than the reference user is presented with a lower video frame rate for that same reference video. For example, a captured performance velocity of 3.35 meters per second translates in a video delivered at 20 frames per second instead of 30, graphically visualizing the 33% slower forward motion differential.

By contrast, a user who is performing faster than the reference user is presented with a higher video frame rate for that reference video. For example, a captured performance velocity of 6.65 meters per second translates in a video delivered at 40 frames per second instead of 30, graphically visualizing the 33% faster forward motion differential.

As a single recorded reference video may be composed of multiple viewpoints, each synchronized from the same user dataset referential, such as captured from 360 degrees camera(s) or flying drone(s) for examples, the dynamic video playback of a recorded reference video may bring similar multiple viewpoints to the user of a connected grip system.

In this mode, each viewpoint is effectively a different video which can be selected individually by the user, providing for alternate dynamic playback video while engaging with a connected grip system.

In addition, a user wearing a virtual reality goggle while engaging a particular connected grip system, would be presented with a dynamic frame rate playback video based on the direction that this particular user would face in relation to a point of origin.

For example, if a reference video is made of 2 distinct reference videos, one forward and the other backward, the user would be presented with the forward dynamic frame rate video when looking forward and with the dynamic frame rate backward video when looking backward, as correlated between the reference datasets and the user's real-time datasets.

In addition, video recording devices, such as flying drones for examples, have their flying speed and altitude controlled by computer settings. As a result, the operator of such a device is able to set the flying speed and altitude to match the speed of a particular user on a connected grip system, such as a rowing boat or road bicycle, without necessarily following that user. Therefore, the recorded video in this instance is recorded with parameters known to a particular type of activity and location.

For example, if the known average speed of an experienced rower on a river is 5 meters per second, and known altitude is 3 feet above water, then the flying drone is recording videos flying at a constant 5 meters per second while staying 3 feet above water, therefore simulating the viewpoint that an experienced rover would have while providing for an optimum relationship between frame rate, relative motion and perspective, enabling the dynamic video playback engine to optimize the video playback frame per second delivery.

As another example, if the known average speed of an experienced bicycle riders on a 500 meters long flat surface is 12 meters per second, followed by a 100 meters 15% climb at 6 meters per second, and known altitude is 4 feet above the surface, then the flying drone is recording videos flying at a constant 12 meters per second for the flat surface and slowing down to 6 meters per second during the 100 meters 15% climb.

Connected Grips—"Dual-Handle" Rowing Activities

Every year, rowers from all over the world come to New England to compete at in indoor rowing extravaganza. The youngest competitors have to be at least 12 years old, and in 2016, the eldest was 95 years young. Categories also include those that are physically disabled, intellectually disabled, visually disabled, amputees and veterans.

That is exactly what makes rowing unique. Rowing truly is a lifetime sport that nearly everyone can participate in.

While rowing, the user is in control of the workout. The harder the rower pushes or pulls, the more resistance is created. The activity of rowing utilizes ever major muscle group while being non-weight bearing. There is very little strain on the joints. Regular rowing helps to build a strong cardiovascular system, incredible endurance and long-lean muscles.

Whether looking for a quick efficient fitness routine, a workout to get to the next competition or a safe form of exercise to last a lifetime, rowing activities get you there.

Rowing Technique and Card Reference Datasets

The fundamental elements of the rowing stroke involve coordinating the motion of legs, back and arms. The rowing stroke uses all of these muscle groups, and because these muscle groups vary greatly in strength it is important to use them in the correct sequence.

Figure 11:
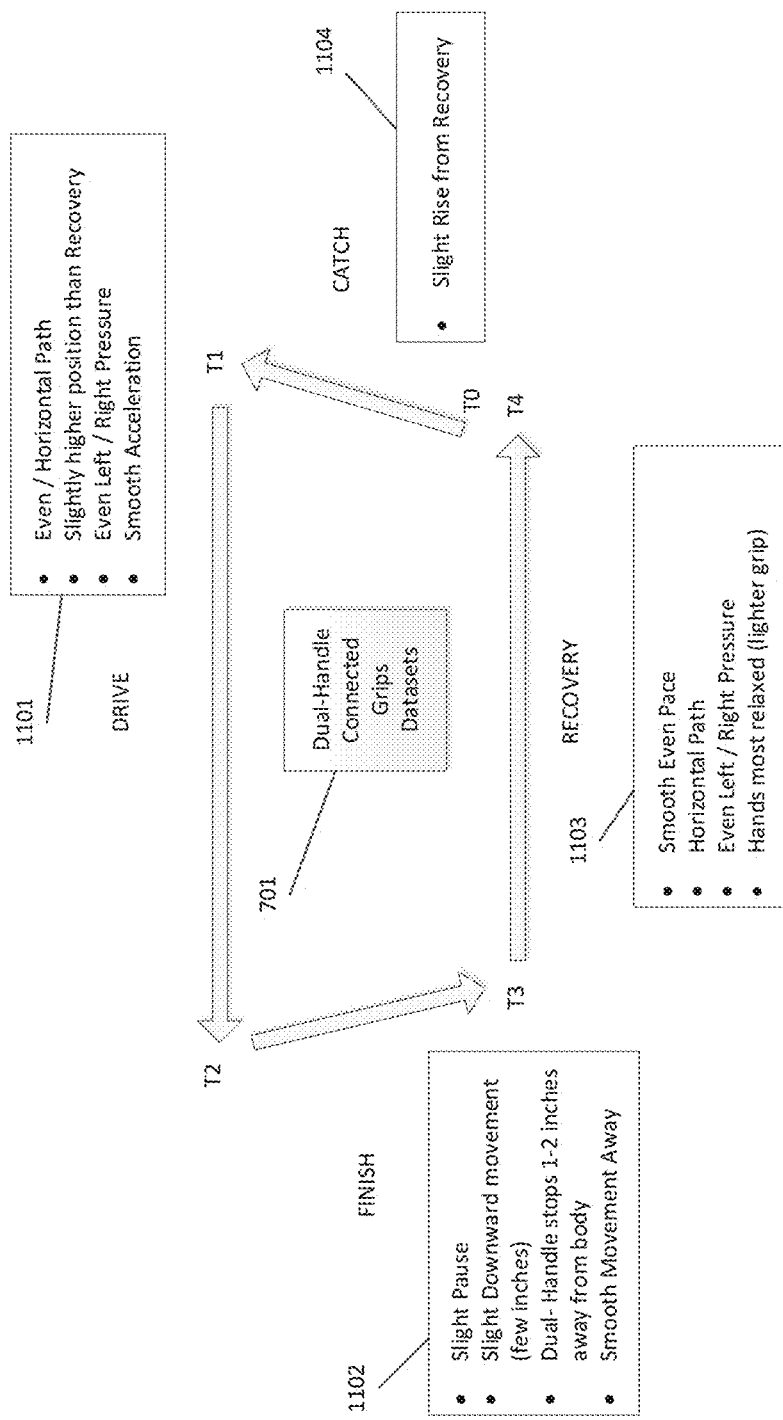
FIG. 11 illustrates the different steps in modeling rowing exercises.

FIG. 11 illustrates the different steps in modeling the rowing exercise "stroke" card, as part of the overall deck of cards for the human internet of things connected grip activities.

As illustrated, a typical rowing exercise is deconstructed into 4 distinct steps expressed over time and defined as "Catch" 1104, "Drive" 1101, "Finish" 1102 and "Recovery" 1103.

The "Catch" 1104 is the "top" of the stroke, when the rower's body is engaged and prepared to exert maximal force. For modeling where the oar blade "catches" the water, and as captured by the connected grip datasets, balls of feet and toes are pressed on the footboard, both knees are bent until shins are perpendicular to the ground, the torso and chest are pressed against thighs. In this step, the shoulders are forward of hips, the arms are straight, including the wrists and both hands are at solar plexus height.

The "Drive" 1101 is the portion of the stroke when the rower is "driving" the boat through the water, exerting force to move the handle of the oar. For modeling, the rower is pushing with legs, leaning with back and pulling with arms. As captured by the connected grip datasets, this step is defined by an even and horizontal path, with a smooth acceleration and even left-hand and right-hand pressure applied onto the dual-handle, using a slightly higher elevated position than the one used in "Recovery".

The "Finish" 1102 is the completion of the exertion portion of the stroke, when the handle is closest to the body. For modeling, the feet are fully pressed against the footboard, legs are flat, torso is tall, shoulders are behind the hips and elbows are bent so the dual-handle is nearly touching the body at the level of the solar plexus. As captured by the connected grip datasets, this step is defined by a slight pause, with a slight downward movement where the dual-handle stops a couple of inches from the rower body and smooth movement away.

The "Recovery" 1103 is the reset portion of the stroke, where the rower prepares for the next drive. On the water, it's also where the boat is running out underneath its rower and moving the fastest. There is emphasis on body control and flow during "Recovery" to let the boat travel as far as it can before the next drive. For modeling, the dual-handle leads the arms then shoulders forward, followed by the knees rising. As captured by the connected grip datasets, this step is defined by a smooth even pace, following a horizontal path, applying an even left- and right-hand light pressure on the dual-handle. Right after the "Finish" step, the knuckles lead the dual-handle away from the body in a straight line and even plane. The shoulders and chest then follow, pivoting from the hips while maintaining a tall posture as the weight transfers from the back to the front of the seat. When the handle reaches the ankles, the knees begin to rise to meet the body and the weight continues to transfer to the balls of the feet, ready for the next "Catch" step when the torso is in contact with the thighs and the shins are perpendicular to the floor.

The work of the rowing stroke is to exert maximum force while the oar is in the water and then let the boat run as far as it can when the oar is out of the water, when it actually moves the fastest. Thus, the time spent in the "Recovery" step is typically 3 times longer than the time spent in the "Drive" step. Although the actual speed is changing based on the stroke rate, the ratio of 3 "recovery" to 1 "drive" is important to track and model.

Based on the captured connected grip datasets, all the time and motion aspects of the above 4 steps are tracked and recorded in real-time by the on-board computer in order to provide direct feedback and recommendation to the rower registered user, and for every stroke during its fitness or competitive session.

As a result, the generic rowing card reference dataset is created from the capture of a particular rowing coach or expert while engaging in rowing exercises and used to model the stroke 4 steps motion as captured by the dataset.

In addition, instructors or coaches may also record their preferred rowing card reference dataset to be used for their students or other registered users of the human internet of things platform.

Rowing Training Exercises

The measurements of rowing training exercises are typically expressed as "stroke rate", "watts" and "spilt time".

The "Split Time" is defined at the time it would take a rower to complete 500 meters at a given stroke rate and exertion.

"Watts" is the power exerted on a given stroke which for the purpose of a workout is calculated as an average based on the speed sensor capturing the flywheel or water basin rotation.

The "Stroke Rate" is the number of full strokes taken in one minute. Typically, short high intensity workouts and assessments are in the range of 28 to 36 strokes per minute. Steady state or aerobic workouts are in the range of 18 to 30 strokes per minute. Specific strength-focused workouts may range from 10 to 16 strokes per minute.

The following is an example of a rowing fitness session expressed as a series of strokes over time and power. This 22 minutes long session is fairly easy at the start and challenging at the end.

2 minutes at 75 Watts with a 22 to 26 Stroke Rate
2 minutes at 90 Watts with a 22 to 26 Stroke Rate
2 minutes at 105 Watts with a 22 to 26 Stroke Rate
2 minutes at 120 Watts with a 22 to 26 Stroke Rate
2 minutes at 135 Watts with a 24 to 28 Stroke Rate
2 minutes at 150 Watts with a 24 to 28 Stroke Rate
2 minutes at 165 Watts with a 24 to 28 Stroke Rate
2 minutes at 180 Watts with a 24 to 28 Stroke Rate
2 minutes at 195 Watts with a 26 to 30 Stroke Rate
2 minutes at 210 Watts with a 26 to 30 Stroke Rate
2 minutes at 225 Watts with a 26 to 30 Stroke Rate
2 minutes at 240 Watts with a 26 to 30 Stroke Rate The above session can be expressed as the following playlist of individual strokes categorized by power over time. Built as a reference exercise, it is first recorded by the human internet of things platform from a registered coach and modeled by the capture of all the connected grips datasets, referenced as RSR, originating from the coach integrated rowing system.

| Session | Time | Reference Datasets | UserID# Datasets | PFI |
|---------|------|-------------------|------------------|-----|
| #1 | T0:00-2:00 | RSR [22-26] | USR [XX-YY] | Computed |
| #1 | T2:00-4:00 | RSR [22-26] | USR [XX-YY] | Computed |
| #1 | T4:00-6:00 | RSR [22-26] | USR [XX-YY] | Computed |
| #1 | T6:00-8:00 | RSR [22-26] | USR [XX-YY] | Computed |
| #1 | T8:00-10:00 | RSR [24-28] | USR [XX-YY] | Computed |
| #1 | T10:00-12:00 | RSR [24-28] | USR [XX-YY] | Computed |
| #1 | T12:00-14:00 | RSR [24-28] | USR [XX-YY] | Computed |
| #1 | T14:00-16:00 | RSR [26-30] | USR [XX-YY] | Computed |
| #1 | T16:00-18:00 | RSR [26-30] | USR [XX-YY] | Computed |
| #1 | T18:00-20:00 | RSR [26-30] | USR [XX-YY] | Computed |
| #1 | T20:00-22:00 | RSR [26-30] | USR [XX-YY] | Computed |

Subsequently, a registered user who is selecting the above session from a list of available rowing exercises is going to get its stroke rate datasets, referenced as USR in the above playlist, as captured and correlated against the reference datasets RSR, providing for real-time comparisons and analysis from the platform multi-dimensional information modeling (MDIM) computation, such as "Motion", "Physiology", "Environment", "Social" and "Diet" among others.

A library of preselected exercises and programs get recorded and modeled by the platform to be offered to its registered users. For example, a standard warm up is going to reinforce technique and prepare the muscles for an upcoming workout. As another example, a 3 days program may include a series of prerecorded referenced exercises to improve technical, endurance and power while providing both visual and auditory cues to its users at any time. Experienced users may take the pause moments to reflect on body position, weight distribution and muscle engagement feedback as provided by the datasets analysis and recommendations of the connected grip applications. As the user becomes more comfortable with the sequence of strokes, it will shorten the pauses so the strokes begin to flow more organically and fluently.

Gamification Examples of Connected Grips Rowing Activities

By leveraging the multimedia features of the on-board computer coupled with the unique datasets from dual-handle connected grips systems, new interactive applications are Rowing Race Simulator In this mode, rowing activity is presented as a series of current or past races based on the virtualization of recorded known race locations, like the river Thames in London, location of the world famous "Henley Royal Regatta" or the Charles River in Boston, location of "The Head of The Charles" Regatta.

Rowing Scenic Adventures

In this mode, connected grips rowing activities are based on scenic locations recorded for the beauty of their environment, like the most beautiful lakes or rivers in the world, for examples.

Rowing Competitive Events

In this mode, competitive events get planned, managed and run by the human internet of things platform. For example, running a virtual Olympics, with its 14 different rowing events, and with on-line teams representing specific countries, or running a simultaneous version of "The Head of the Charles" Regatta online.

Rowing Ship Simulator

In this mode, rowing activity is presented as a simulator of rowing ships, such as a Viking or Roman oared boats, where a virtual team of online connected grip rowers join together to crew a virtual representation of such boats. For example, the Viking longships ranged from the Karvi, with 13 rowing benches, to the Busse, one of which has been found with an estimated 34 rowing positions. As another example, the "Navis actuaria" was a type of transport ship used by the Roman navy and up to 30 oars, with 15 on each side.

Rowing Combat Simulator

In classical antiquity, a ship's main weapon was the ram, which was used to sink or immobilize an enemy ship by holing its hull. In this mode, rowing battle activity is presented as a virtual flight between 2 or more fleets, each made of several oared ships crewed by connected grips rowers which fight each other.

For example, in 241. B.C. at the battle of the Aegates Islands between the navies of the Roman Republic and the North African city-state of Carthage, the Roman vessels were able to outmaneuver the Carthaginians' heavier ships and use their bronze rams and wooden boarding ramps to devastating effect. Half of Carthage's fleet was soon destroyed or captured, leaving its generals no choice but to agree to harsh terms of surrender to end the war.

Other Gamification Examples

Many other examples of gamifications may also be envisioned by adding external factors such as weather, time of day or tide as well as providing support for Virtual Reality video using dynamic video payback to bring an even more immersive multimedia experience to connected grips activities.

J. Connected Grips Systems Universal Login

Connected grips integrated systems, such as dual-handle rowing integrated systems or connected jump ropes for examples, are capturing multidimensional data layers of information about activities performed by registered users while engaging with these connected grips systems.

From a system perspective, as these various connected integrated devices may be used by different individual overtime, it is important to provide one, or more, methods for associating a particular set of activities to a specific individual in order to provide personalized coaching and feedback as well as protect the data of these individual registered users.

In addition, as registered users may use multiple connected grips systems in the course of specific fitness or sport activities, such as for examples in a gym location or while traveling, it is important for the human internet of things platform to be able to aggregate these individual activities regardless of the particular type of connected grips systems or their physical locations.

Figure 12:
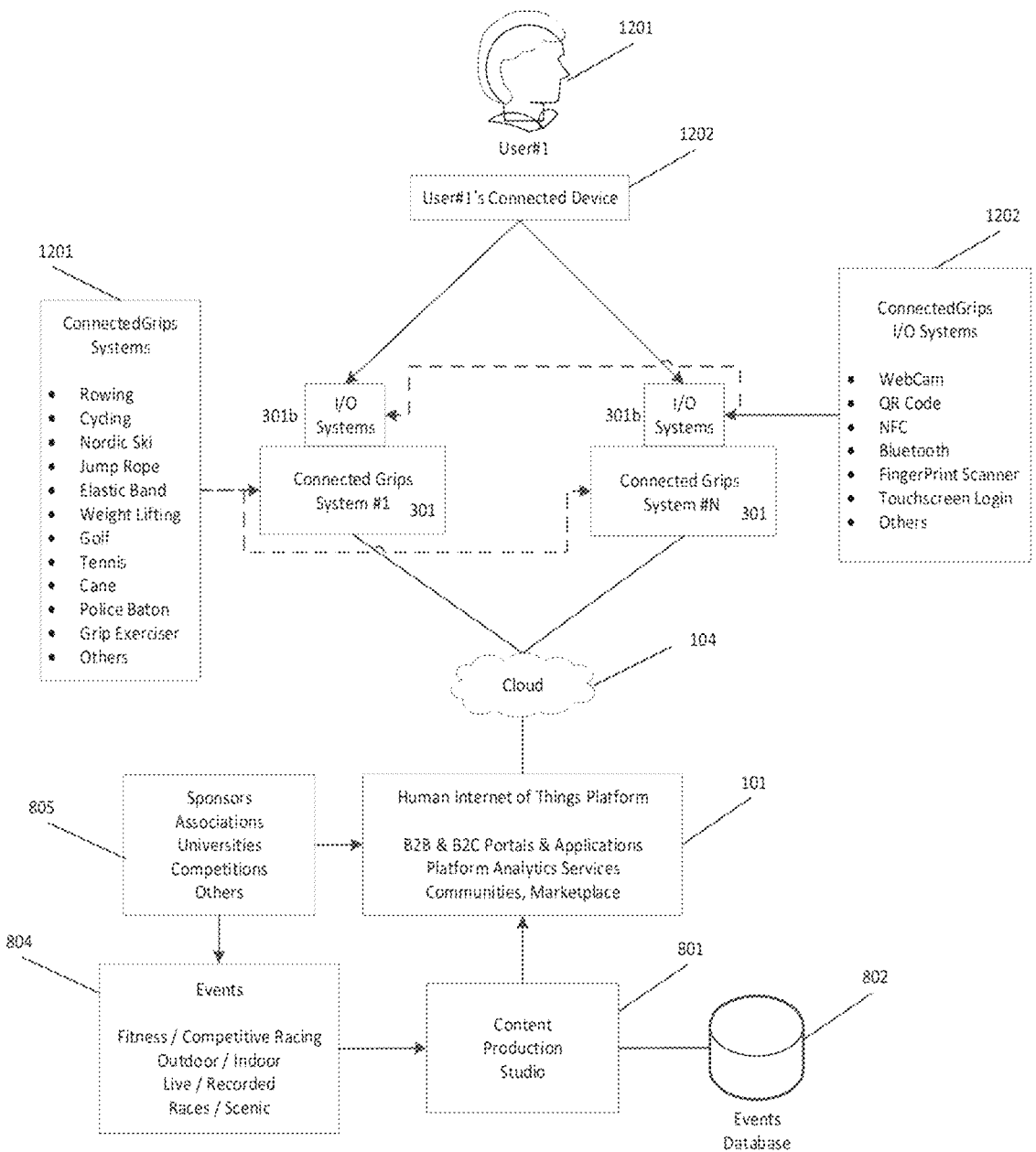
FIG. 12 illustrates a method of universal login to multiple connected grips systems by users, regardless of location or type of connected grips systems.

FIG. 12 illustrates several methods that a registered user of the human internet of things platform may use to login to specific connected grips systems, regardless of types or locations.

For instance, connected grips systems 1201, such as rowing, cycling, jump rope or elastic band for examples, may leverage the built-in webcam of their I/O systems 1202 onboard computer to connect the individual in front of that webcam to an existing profile of a registered user 1201 using its connected device 1202.

For example, the webcam of the connected grip I/O systems onboard computer, such as a rowing or cycling system, jump rope or elastic band, is scanning and capturing a QR code presented to it by a registered user of the human internet of things platform. As this QR code is unique to a registered user, the connected grips platform is able to match the profile of that registered user to any subsequent activities performed using this particular connected grips system.

As another example, the webcam of the connected grips I/O systems on board computer is scanning and capturing the face of the individual located in front of the system and authenticating that individual based on face recognition software algorithm running either locally or on the human internet of things platform.

As yet another example, connected grips I/O systems may use different methods of user's identification, including for examples near-field communication (NFC), Bluetooth hopping or fingerprint scanner to match an individual to a registered user profile.

Alternatively, each connected grip systems may be manufactured and deployed with a unique identifier, such a bar code or QR code, which may be displayed at a particular location onto the frame of the connected grip systems.

For instance, a registered user who is scanning that unique identifier via its connected grip mobile application running on its connected mobile device is matched by the human internet of things platform prior to engage into any specific activities with that particular connected grip system.

Additional Security Services

Specific services or applications of the human internet of things platform may require additional level of security besides the matching of a unique code to a registered user profile.

For instance, reviewing user's captured data, updating user's account information, joining an online competitive race, joining an online competitive team or purchasing a subscription, among others, might each need to be approved and verified by their rightful owner prior to be effectively processed by the human internet of things platform.

Specifically, unlocking access to these security-based services may be implemented by leveraging the built-in fingerprint scanner of the registered user mobile connected device while running the connected grip mobile application. Such a feature is now standard in most smartphones or tablets and used to enable certain payment features such as in-app subscriptions, for example.

In this mode, the user's fingerprint is processed and verified by the user's connected device, providing the user's connected grip application with the required clearance to proceed with the restricted in-application and human internet of things platform specific services.

By contrast, the I/O systems of connected grip systems may be integrating a fingerprint scanner. In this implementation, the connected grip system is scanning the user's fingerprint, either locally or on-line, effectively matching the captured fingerprint with its corresponding registered user and giving clearance to proceed with the restricted in-application and human internet of things platform specific services.

Other methods of security may include the use of one-time-passcode, voice recognition, facial recognition, or any combination thereof, provided either by the user's connected device or the connected grip integrated systems, which would be required by the rules of particular connected grip applications or services.

What is claimed is:

1. A method, comprising:
    obtaining a video for a fitness-related activity as performed by a reference user, the video having a frame rate;
    obtaining first data characterizing effort of the reference user for the fitness-related activity, wherein the first data are synchronized with the video;
    playing the video to a non-reference user as the non-reference user performs the fitness-related activity; and while playing the video to the non-reference user as the non-reference user performs the fitness-related activity:
capturing second data characterizing effort of the non-reference user for the fitness-related activity,
comparing the second data to the first data, to determine a difference between the effort of the non-reference user and the effort of the reference user, and
adjusting the frame rate of the video being played to the non-reference user based on the difference.

2. The method of claim 1, wherein:
the comparing comprises determining that the non-reference user is slower than the reference user; and
the adjusting comprises reducing the frame rate in response to determining that the non-reference user is slower than the reference user.

3. The method of claim 1, wherein:
the comparing comprises determining that the non-reference user is faster than the reference user; and
the adjusting comprises increasing the frame rate in response to determining that the non-reference user is faster than the reference user.

4. The method of claim 1, further comprising repeatedly performing the capturing, the comparing, and the adjusting while playing the video to the non-reference user as the non-reference user performs the fitness-related activity.

5. The method of claim 1, wherein:
the non-reference user performs the fitness-related activity using an item of fitness equipment that comprises a grip having embedded sensors; and
capturing the second data comprises capturing sensor data using the embedded sensors in the grip.

6. The method of claim 1, wherein:
the non-reference user performs the fitness-related activity using an item of fitness equipment that comprises dual-handle grips having embedded sensors; and
capturing the second data comprises capturing sensor data using the embedded sensors in the dual-handle grips.

7. The method of claim 1, wherein the video comprises video from multiple angles, the video from the multiple angles being synchronized with the first data.

8. The method of claim 7, wherein playing the video comprises displaying the video on virtual-reality (VR) goggles worn by the non-reference user based on a direction in which the non-reference user faces.

9. The method of claim 8, wherein:
the video from the multiple camera angles comprises forward video and backward video; and
displaying the video on the VR goggles comprises displaying the forward video when the non-reference user faces forward and displaying the backward video when the non-reference user faces backward.

10. The method of claim 1, wherein the video comprises video from multiple angles and viewpoints, the video from the multiple angles and viewpoints being synchronized with the first data.

11. The method of claim 1, wherein:
the first data are multi-dimensional with respective dimensions selected from the group consisting of motion data, physiological data, and environmental data; and
the second data are multi-dimensional with respective dimensions selected from the group consisting of motion data, physiological data, and environmental data.

12. The method of claim 1, wherein:
obtaining the video comprises recording the video while the reference user performs the fitness-related activity using an item of fitness equipment that comprises a grip having embedded sensors; and
obtaining the first data comprises capturing data using the embedded sensors while recording the video.

13. The method of claim 1, wherein:
obtaining the video comprises recording the video while the reference user performs the fitness-related activity using an item of fitness equipment that comprises dual-handle grips having embedded sensors; and
obtaining the first data comprises capturing data using the embedded sensors while recording the video.

14. The method of claim 1, wherein the fitness-related activity is selected from the group consisting of an individual fitness exercise, a coach-driven session, a competitive event, and a team-based competitive event.

* * * * *